(12) United States Patent
Son et al.

(10) Patent No.: US 10,192,883 B2
(45) Date of Patent: Jan. 29, 2019

(54) VERTICAL MEMORY DEVICE

(71) Applicant: SAMSUNG ELECTRONICS CO., LTD., Suwon-si, Gyeonggi-do (KR)

(72) Inventors: Young Hwan Son, Hwaseong-si (KR); Young Woo Park, Seoul (KR); Jae Duk Lee, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 9 days.

(21) Appl. No.: 15/863,342

(22) Filed: Jan. 5, 2018

(65) Prior Publication Data

US 2018/0130821 A1 May 10, 2018

Related U.S. Application Data

(62) Division of application No. 15/218,421, filed on Jul. 25, 2016, now Pat. No. 9,887,208.

(30) Foreign Application Priority Data

Nov. 10, 2015 (KR) .......................... 10-2015-0157580

(51) Int. Cl.
| | |
|---|---|
| *H01L 27/115* | (2017.01) |
| *G11C 16/04* | (2006.01) |
| *H01L 27/11582* | (2017.01) |
| *H01L 27/11573* | (2017.01) |
| *G11C 16/26* | (2006.01) |

(Continued)

(52) U.S. Cl.
CPC .... *H01L 27/11582* (2013.01); *G11C 16/0466* (2013.01); *G11C 16/10* (2013.01); *G11C 16/26* (2013.01); *H01L 27/1157* (2013.01); *H01L 27/11565* (2013.01); *H01L 27/11573* (2013.01); *H01L 27/11575* (2013.01)

(58) Field of Classification Search
CPC ......... H01L 27/11526; H01L 27/11568; H01L 27/11582; H01L 27/11573; H01L 27/1157; H01L 27/11575; H01L 27/11578; H01L 27/1156; H01L 27/11551; G11C 16/26; G11C 16/04; G11C 16/10

See application file for complete search history.

(56) References Cited

U.S. PATENT DOCUMENTS

| | | |
|---|---|---|
| 2017/0133398 A1 | 5/2017 | Son et al. |
| 2017/0194347 A1 | 7/2017 | Lee et al. |
| 2017/0373079 A1* | 12/2017 | Sharangpani ..... H01L 27/11556 |

* cited by examiner

*Primary Examiner* — Thanhha Pham
(74) *Attorney, Agent, or Firm* — F. Chau & Associates, LLC

(57) ABSTRACT

A memory device may include a peripheral region and a cell region. The peripheral region may include a first substrate, a plurality of circuit elements disposed on the first substrate, a first insulating layer disposed on the plurality of circuit elements, and a first protective layer disposed in the first insulating layer. The cell region may include a second substrate disposed on the first insulating layer, wherein the ceil region includes a first impurity region, a channel region extending in a direction substantially perpendicular to an upper surface of the second substrate, a plurality of gate electrode layers stacked on the second substrate and adjacent to the channel region, and a first contact electrically connected to the first impurity region, wherein the first protective layer is disposed below the first impurity region, and has a shape corresponding to a shape of the first impurity region.

5 Claims, 38 Drawing Sheets

(51) Int. Cl.
*G11C 16/10* (2006.01)
*H01L 27/11565* (2017.01)
*H01L 27/1157* (2017.01)
*H01L 27/11575* (2017.01)

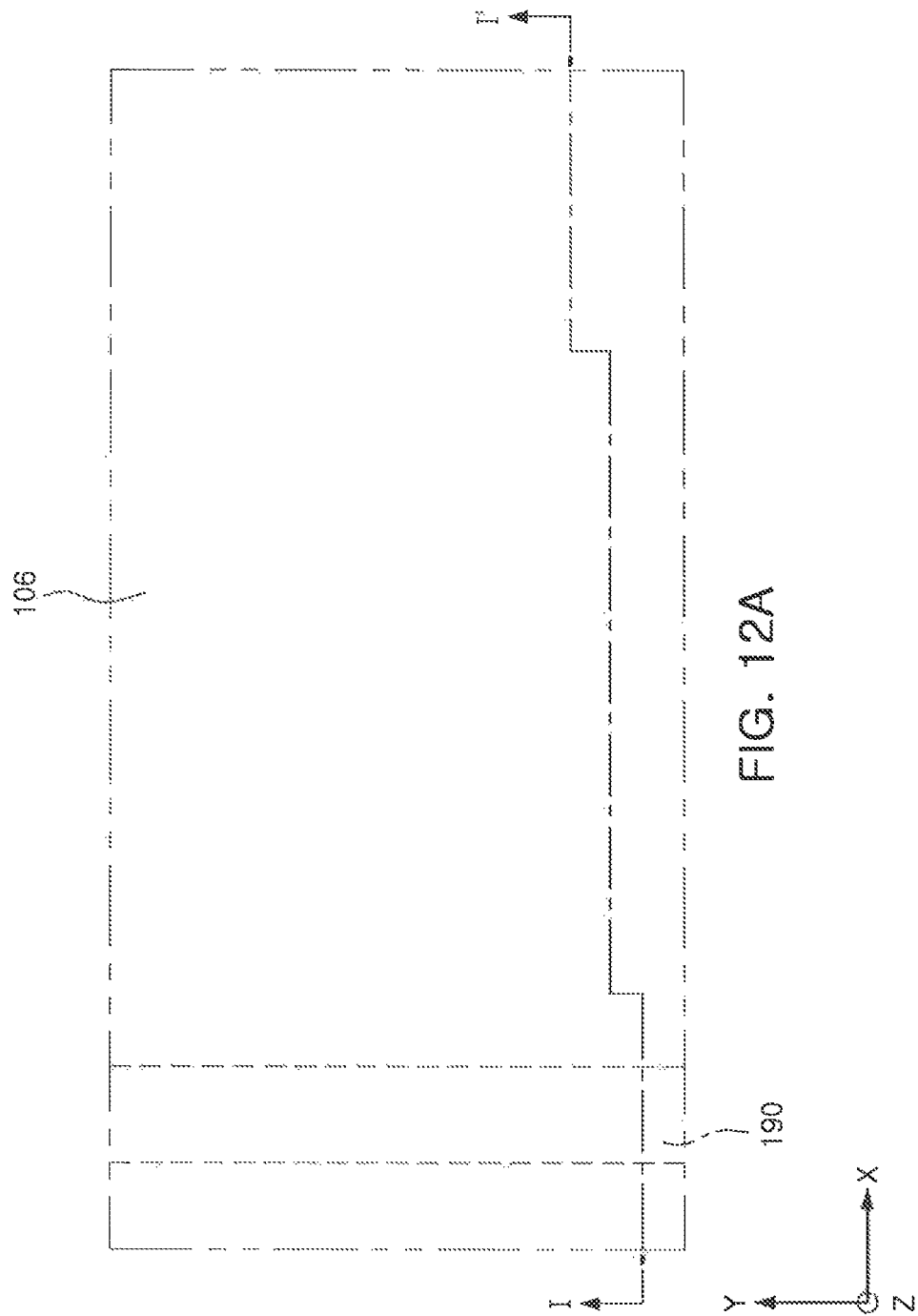

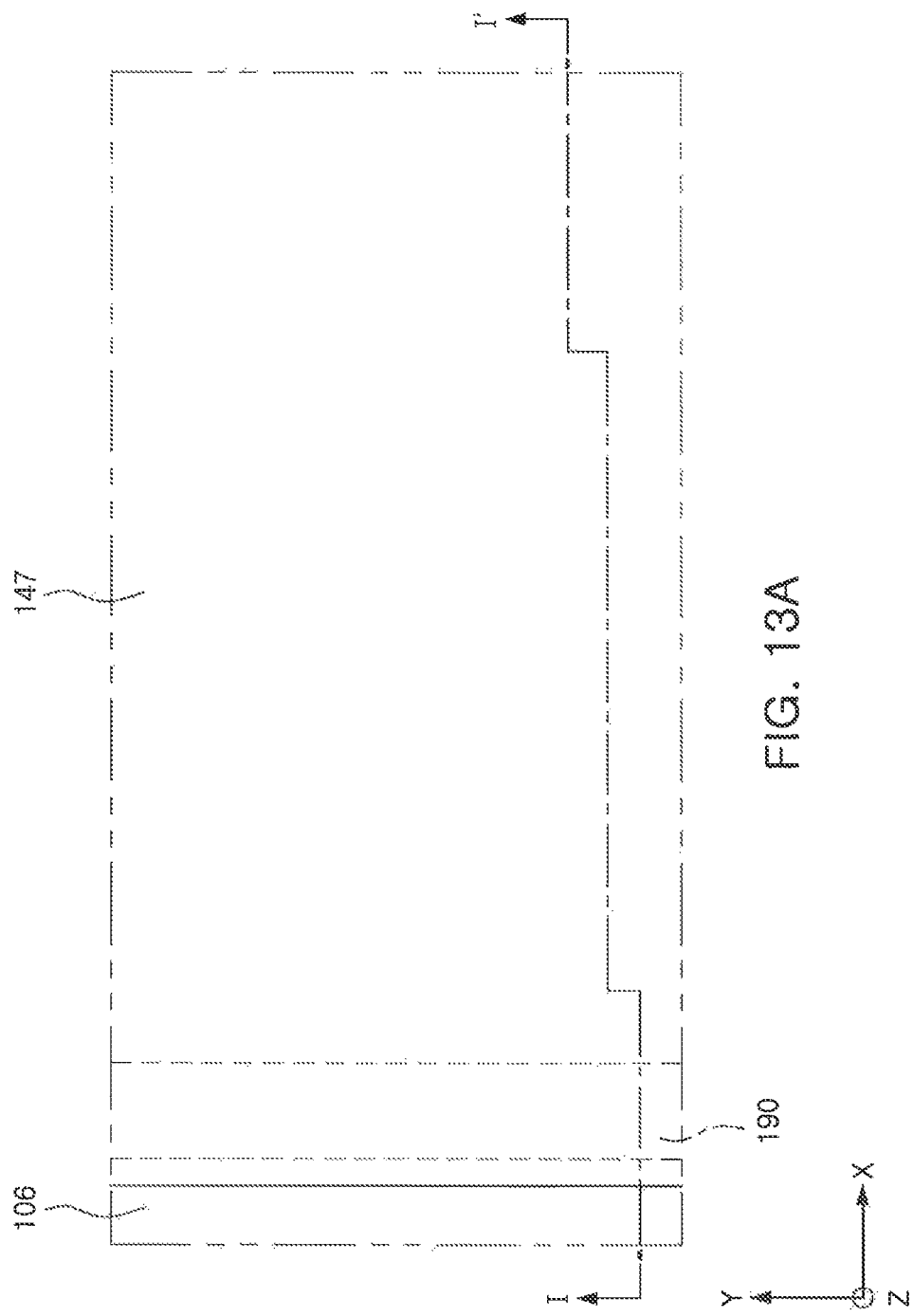

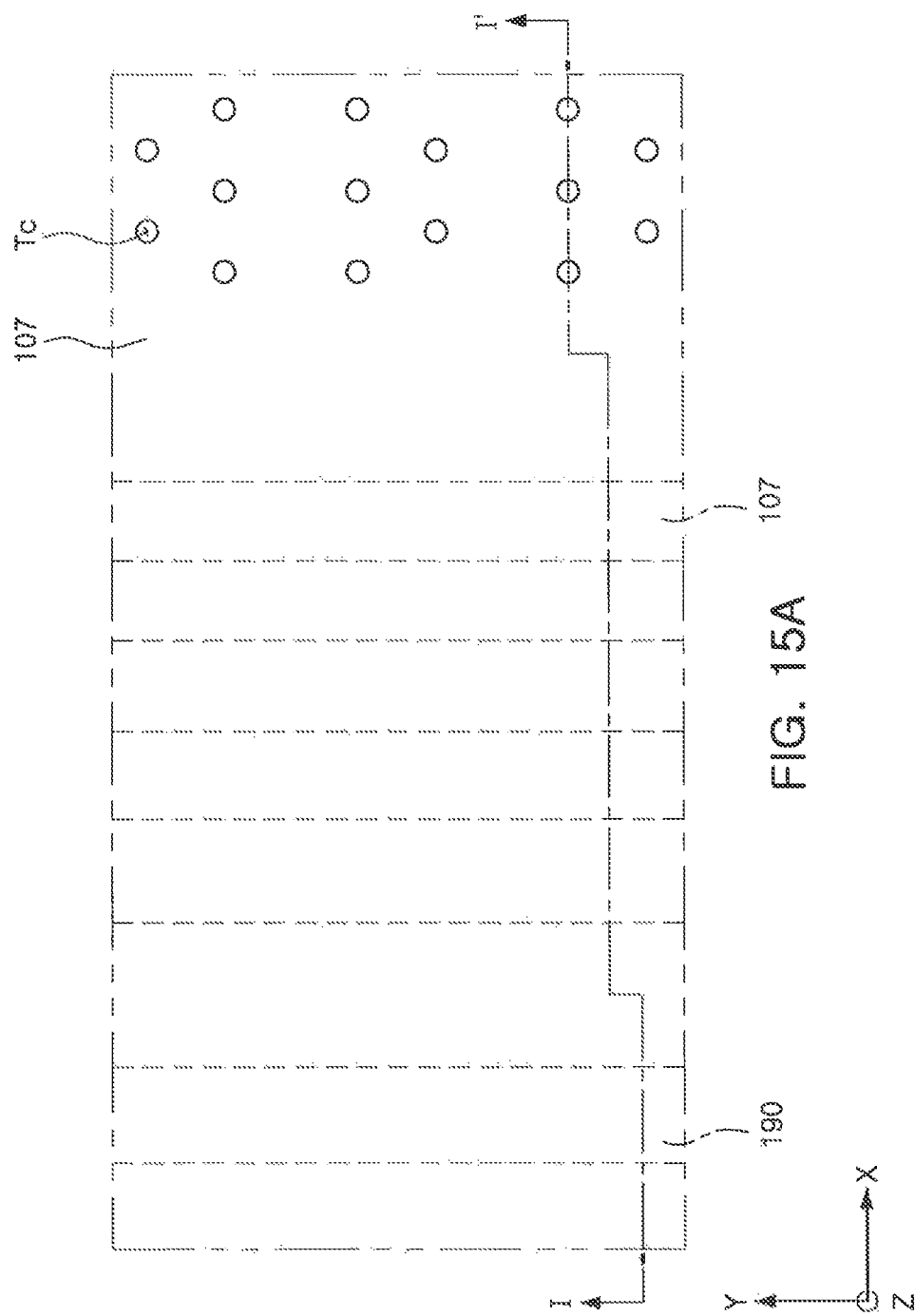

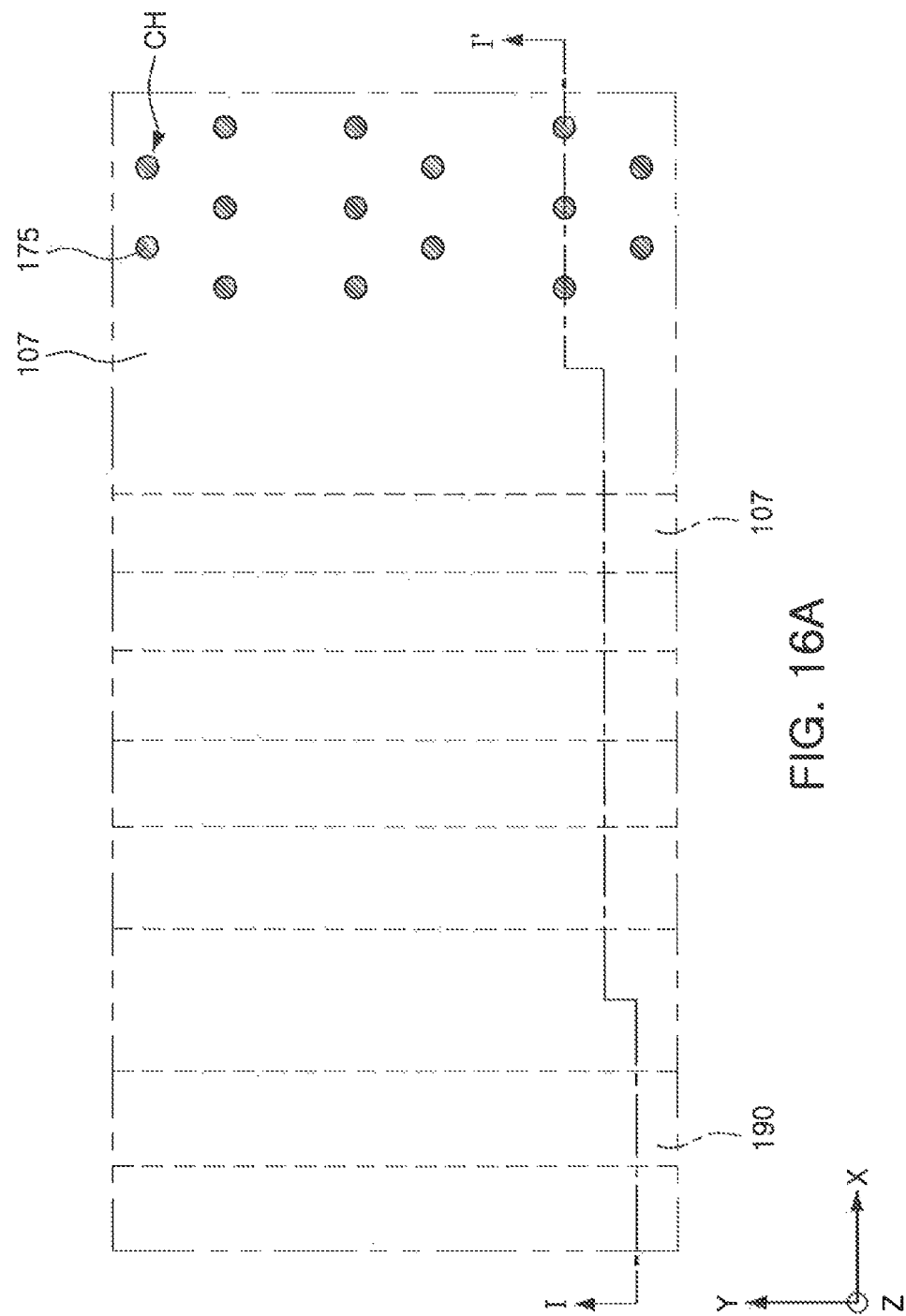

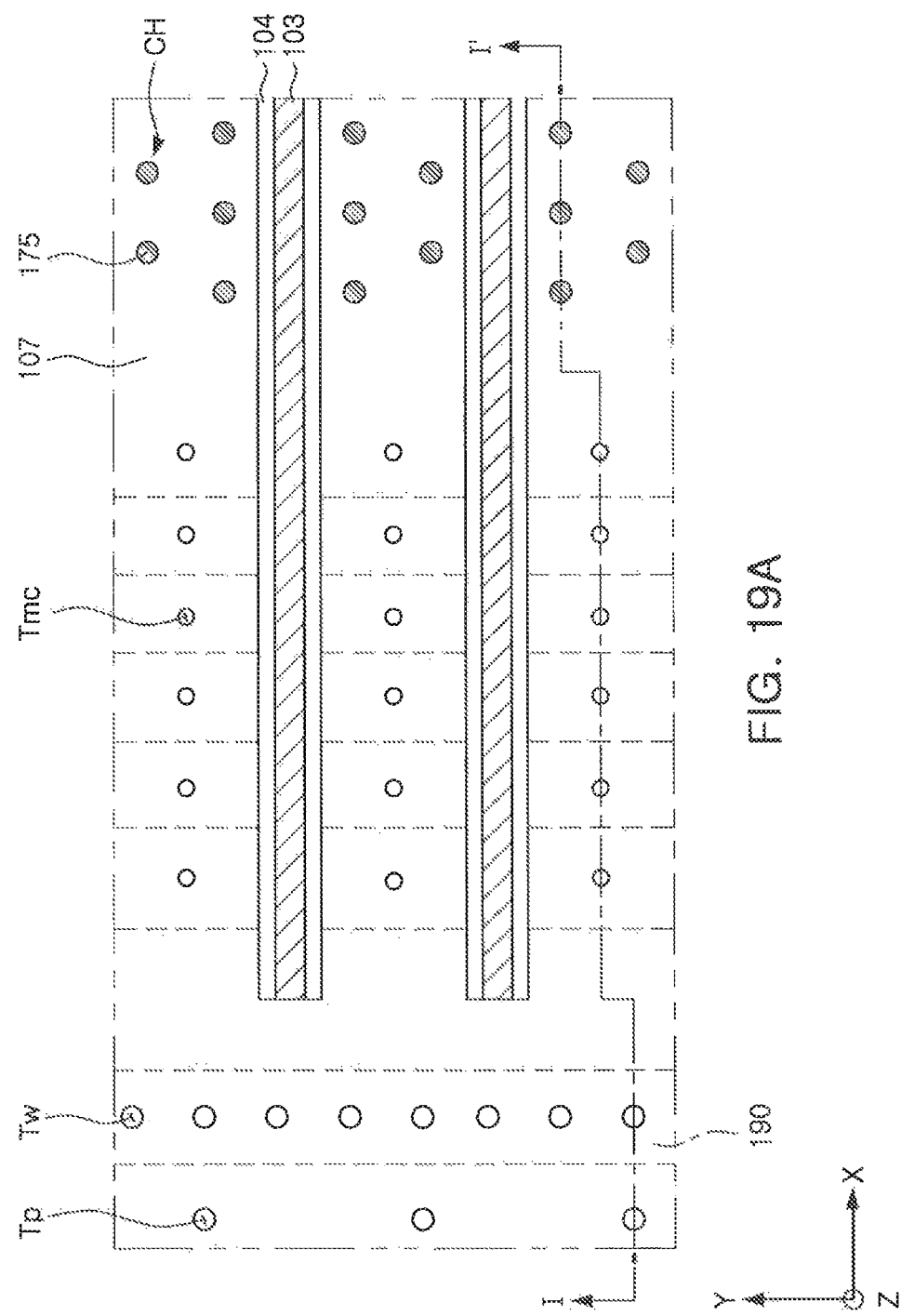

VERTICAL MEMORY DEVICE

CROSS-REFERENCE TO RELATED APPLICATION

This application is a divisional application of co-pending U.S. application Ser. No. 15/218,421, filed on Jul. 25, 2016, which claims priority under 35 U.S.C. § 119 to Korean Patent Application No. 10-2015-0157580, filed on Nov. 10, 2015 in the Korean Intellectual Property Office, the disclosures of which are incorporated-by-reference herein in their entireties.

TECHNICAL FIELD

Exemplary embodiments of the present inventive concept relate to a memory device, and more particularly to a vertical memory device with integrated memory elements.

DISCUSSION OF RELATED ART

Electronics are increasingly required to process high-capacity data while being gradually reduced in volume. To accomplish this, semiconductor memory elements are being made with an increasing degree of integration. To increase a degree of integration in semiconductor memory elements, a memory device having a vertical transistor structure may be used.

SUMMARY

According to an exemplary embodiment of the present inventive concept, a memory device includes a peripheral region including a first substrate, a plurality of circuit elements disposed on the first substrate, a first insulating layer disposed on the plurality of circuit elements, and a first protective layer disposed, in the first insulating layer; and a cell region including a second substrate disposed on the first insulating layer, wherein the cell region includes a first impurity region, a channel region extending in a direction substantially perpendicular to an upper surface of the second substrate, a plurality of gate electrode layers stacked on the second substrate and adjacent to the channel region, and a first contact electrically connected to the first impurity region, wherein the first protective layer is disposed below the first impurity region, and has a shape corresponding to a shape of the first impurity region.

According to an exemplary embodiment of the inventive concept, a memory device includes a first insulating layer overlapping a plurality of circuit elements disposed on a first substrate, a second substrate disposed on the first insulating layer, a channel region extending in a direction substantially perpendicular to an upper surface of the second substrate, a plurality of gate electrode layers stacked on the second substrate and adjacent to the channel region, a plurality of contacts including a plurality of first contacts connected to the second substrate, and a plurality of second contacts respectively connected to the plurality of gate electrode layers; and a protective layer disposed below the plurality of the first contacts in the first insulating layer, and extending in the same direction as the plurality of first contacts.

According to an exemplary embodiment of the present inventive concept, a memory device includes a first region including a first substrate, a plurality of circuit elements disposed on the first substrate, a first insulating layer disposed on the plurality of circuit elements, and a protective layer disposed in the first insulating layer; and a second region including a second substrate disposed on the first insulating layer, wherein the second substrate includes a first impurity region, a channel region extending in a first direction substantially perpendicular to an upper surface of the second substrate, and a plurality of gate electrode layers stacked on the second substrate and adjacent to the channel region, wherein the protective layer is disposed below the first impurity regions, and includes a plurality of regions separated from each other.

BRIEF DESCRIPTION OF DRAWINGS

The above and other features of the present inventive concept will become more apparent by describing in detail exemplary embodiments thereof, with reference to the accompanying drawings, in which:

FIGS. 12A, 12B, 13A, 13B, 14A, 14B, 15A, 15B, 16A, 16B, 17A, 17B, 18A, 18B, 19A, 19B, 20A, 20B, 21A, and 21B are views of a method of manufacturing the memory device illustrated in FIGS. 3 through 5, respectively, according to an exemplary embodiment of the present inventive concept;

DETAILED DESCRIPTION OF THE EMBODIMENTS

Exemplary embodiments of the present inventive concept will be described as follows with reference to the attached drawings.

Figure 1:
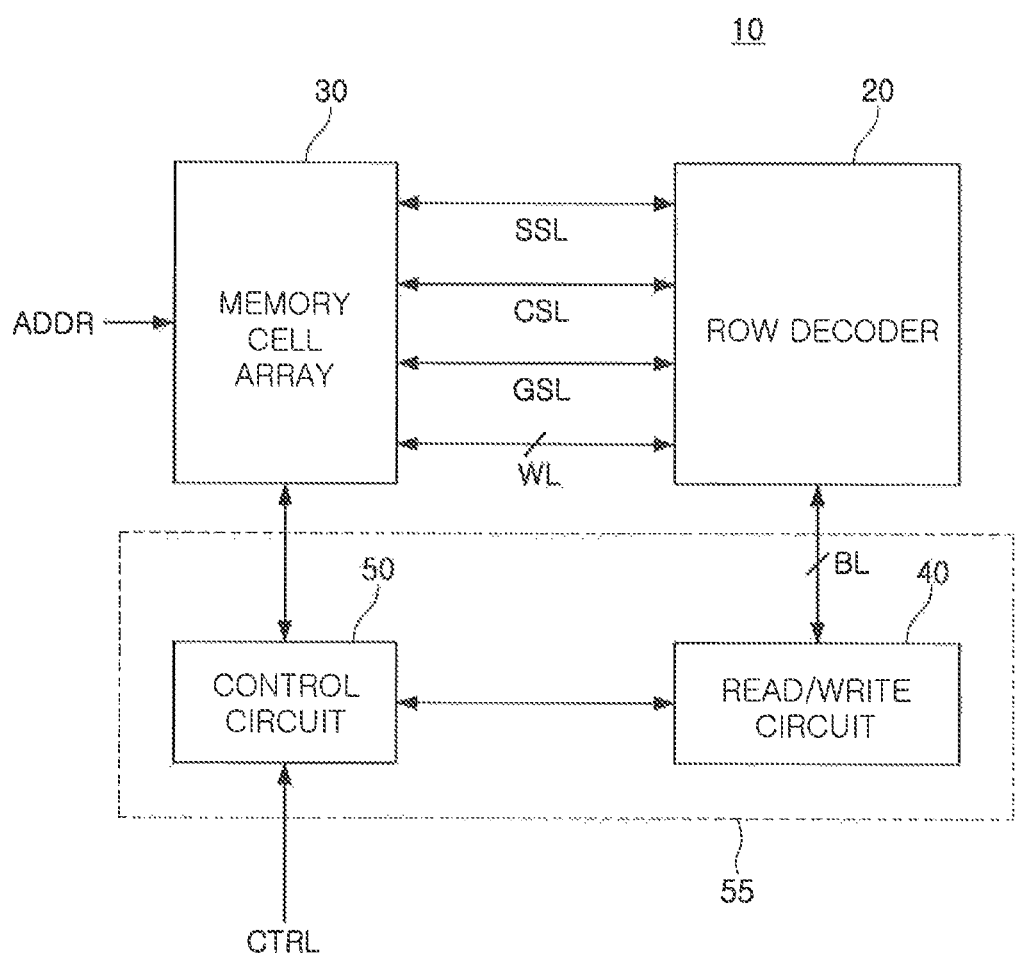
FIG. 1 is a schematic block diagram of a memory device according to an exemplary embodiment of the present inventive concept.

FIG. 1 is a schematic block diagram of a memory device according to an exemplary embodiment of the present inventive concept.

Referring to FIG. 1, a semiconductor device 10 according to an exemplary embodiment of the present inventive concept may include a memory cell array 30, a row decoder 20, and a core logic circuit 55. The core logic circuit 55 may include a read/write circuit 40 and a control circuit 50.

The memory cell array 30 may include a plurality of memory cells arranged in a plurality of rows and a plurality of columns. The plurality of memory cells included in the memory cell array 30 may be connected to the row decoder 20 through a word line WL, a common source line CSL, a string select line SSL, a ground select line GSL, and the like. The row decoder 20 may be connected to the read/write circuit 40 through a bit line BL. In an exemplary embodiment of the present inventive concept, a plurality of memory cells arranged in a row may be connected to a word line WL, and a plurality of memory cells arranged in a column may be connected to a bit line BL. For example, the word lines of a first row may be connected to a first word line, and the memory cells of a first column may be connected to a first bit line.

The plurality of memory cells included in the memory cell array 30 may be divided into a plurality of memory blocks. Each of the memory blocks may include a plurality of word lines WLs, a plurality of string select lines SSLs, a plurality of ground select lines GSLs, a plurality of bit lines BLs, and at least one common source line CSL.

The row decoder 20 may externally receive address ADDR information and decode the received ADDR information to select at least a portion of the word line WL, the common source line CSL, the string select line SSL, and the ground select line GSL connected to the memory cell array 30. The address ADDR may be provided from an external device, for example.

The read/write circuit 40 may select at least a portion of bit lines BLs connected to the memory cell array 30 in response to a command received from the control circuit 50. The read/write circuit 40 may read data stored in a memory cell connected to a selected portion of the bit lines BLs, or may write data to the memory cell connected to the selected portion of the bit lines BLs. The read/write circuit 40 may include circuits, such as a page buffer, an input/output (I/O) buffer, and a data latch and may perform the operations described above.

The control circuit 50 may control operations of the row decoder 20 and the read/write circuit 40 in response to a control signal CTRL transmitted from an external source. In a case in which data stored in the memory cell array 30 is read, the control circuit 50 may control operations of the row decoder 20 to supply a voltage for a data reading operation to a word line in which data required to be read is stored. When a voltage for a data reading operation is supplied to a certain word line WL, the control circuit 50 may control the read/write circuit 40 to read data stored in a memory cell connected to the word line WL to which the voltage for the data reading operation is supplied.

In addition, in a case in which data in the memory cell array 30 is written, the control, circuit 50 may control operations of the row decoder 20 to supply a voltage for a data writing operation to a word line WL in which data is required to be written. When a voltage for a data writing operation is supplied to a certain word line WL, the control circuit 50 may control the read/write circuit 40 to write data to a memory cell connected to the word line WL to which the voltage for the data writing operation is supplied.

Figure 2:
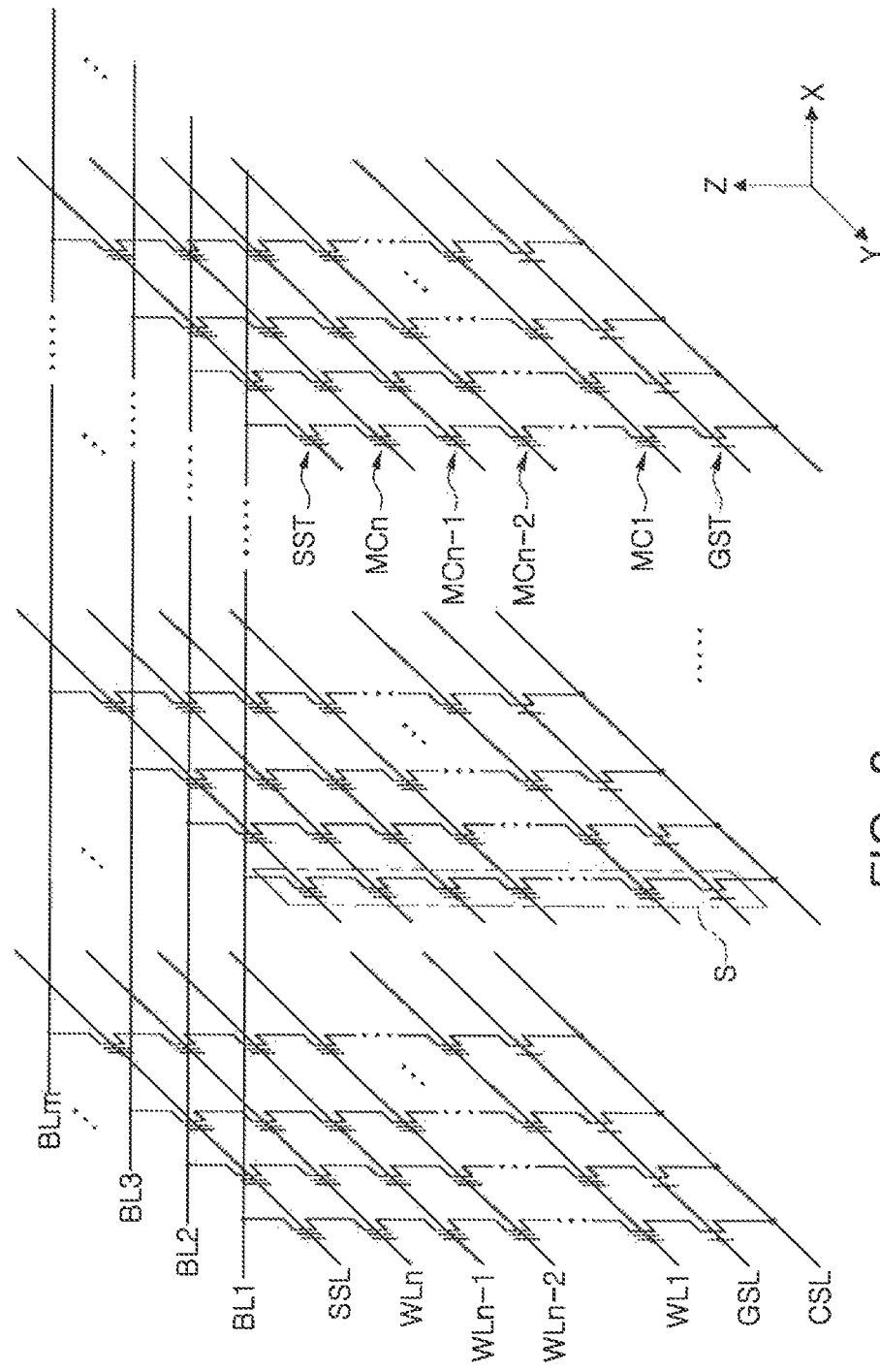
FIG. 2 is a circuit diagram of a memory cell array which may be applied in a memory device according to an exemplary embodiment of the present inventive concept.

FIG. 2 is an equivalent circuit diagram of a memory cell array of a memory device according to an exemplary embodiment of the present inventive concept. A semiconductor device according to an exemplary embodiment of the present inventive concept may be a vertical NAND flash element.

Referring to FIG. 2, each memory cell array may include a plurality of memory cell strings S. Each memory cell string S includes n memory cells MC1 to MCn connected to each other in series (n may be an integer greater than one), and a ground select transistor GST and a string select transistor SST connected to both ends of the memory cells MC1 to MCn in series.

The n memory cells MC1 to MCn connected to each other in series may be respectively connected to n word lines WL1 to WLn for selecting the memory cells MC1 to MCn.

A gate terminal of the ground select transistor GST may be connected to a ground select line GSL, and a source terminal of the ground select transistor GST may be connected to a common source line CSL. In addition, a gate terminal of the string select transistor SST may be connected to a string select line SSL, and a source terminal of the string select transistor SST may be connected to a drain terminal of the memory cell MCn. FIG. 2 illustrates a structure in which the ground select transistor GST and the string select transistor SST are connected to the n memory cells MC1 to MCn connected to each other in series, for example, one by one. In addition, a plurality of ground select transistors GSTs or a plurality of string select transistors SSTs may also be connected to the n memory cells MC1 to MCn.

A drain terminal of the string select transistor SST may be connected to a plurality of bit lines BL1 to BLm, When a signal is applied to the gate terminal of the string select transistor SST through the string select line SSL, a signal applied through the plurality of bit lines BL1 to BLm, and might then be transmitted to the n memory cells MC1 to MCn connected to each other in series. In this case, a data reading operation or a data writing operation may be performed. In addition, when the source terminal of the string select transistor SST allows a signal to be applied through the gate select line GSL to the gate terminal of the gate select transistor GST connected to the common source line CSL, an erase operation, which removes all electric charges stored in the n memory cells MC1 to MCn, may be performed.

Figure 3:
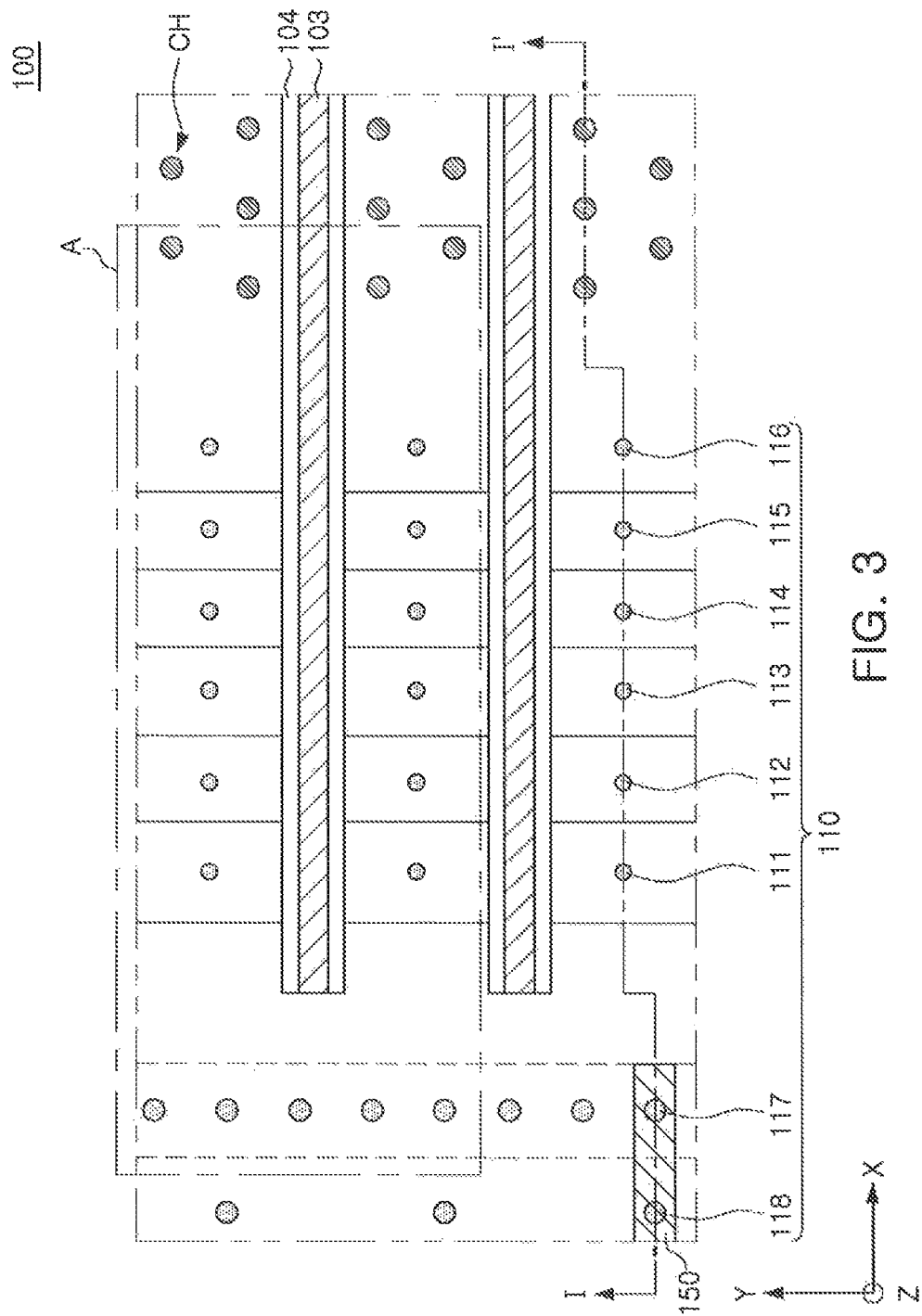
FIG. 3 is a plan view of a memory device according to an exemplary embodiment of the present inventive concept.

FIG. 3 is a plan view of a memory device according to an exemplary embodiment of the present inventive concept.

Referring to FIG. 3, a memory device 100 according to an exemplary embodiment of the present inventive concept may include channel regions CH, first contacts 117 connected to a substrate, a plurality of second contacts 111 to 116 connected to a plurality of gate electrode layers stacked on the substrate, third contacts 118 connected to at least one of a plurality of circuit elements, isolation insulating layers 104 that isolate the gate electrode layers into a plurality of regions, and the like. The plurality of second contacts 111 to 116 are adjacent to the channel regions CH. Further, the channel regions CH, the plurality of contacts 111 to 118 (e.g., generally denoted as 110), and an upper surface of the substrate may correspond to an X-Y plane. The plurality of contacts 110 may extend in the Z-axis direction, for example. In addition, the plurality of gate electrode layers connected to the plurality of second contacts 111 to 116 may be disposed in the Z-axis direction to be stacked on the upper surface of the substrate corresponding to the X-Y plane.

The channel regions CHs may be disposed to be spaced apart from each other in a first direction (e.g. an X-axis direction) and a second direction (e.g. an Y-axis direction).

Further, the channel CHs may extend in the Z-axis direction. The number and an arrangement of the channel regions CHs may vary according to exemplary embodiments of the present inventive concept. For example, the channel regions CHs may be disposed in a zigzag manner as illustrated in FIG. 3. The arrangement of the channel regions CHs adjacent to each other, with the isolation insulating layers 104 interposed therebetween may be symmetrical as illustrated in FIG. 3, but is not limited thereto.

The plurality of gate electrode layers, the channel regions CHs, and the like may be divided into a plurality of regions by common source lines 103 and the isolation insulating layers 104 disposed around the common source lines 103. Each of the plurality of regions defined by the common source lines 103 and the isolation insulating layers 104 may be provided as a unit cell of the memory device 100. A source region may be provided below the common source lines 103 in the Z-axis direction, and when a certain level of voltage is applied to the source region, a data erase operation may be performed in cell units of the memory device 100.

The first contacts 117 may be disposed between the plurality of second contacts 111 to 116 and third contacts 118 in a single direction, for example, in the X-axis direction. In addition, the first contacts 117 may be connected with the third contacts 118 by a metal layer 150.

The memory device 100 of FIG. 3 will hereinafter be described with reference to FIGS. 4 and 5.

Figure 4:
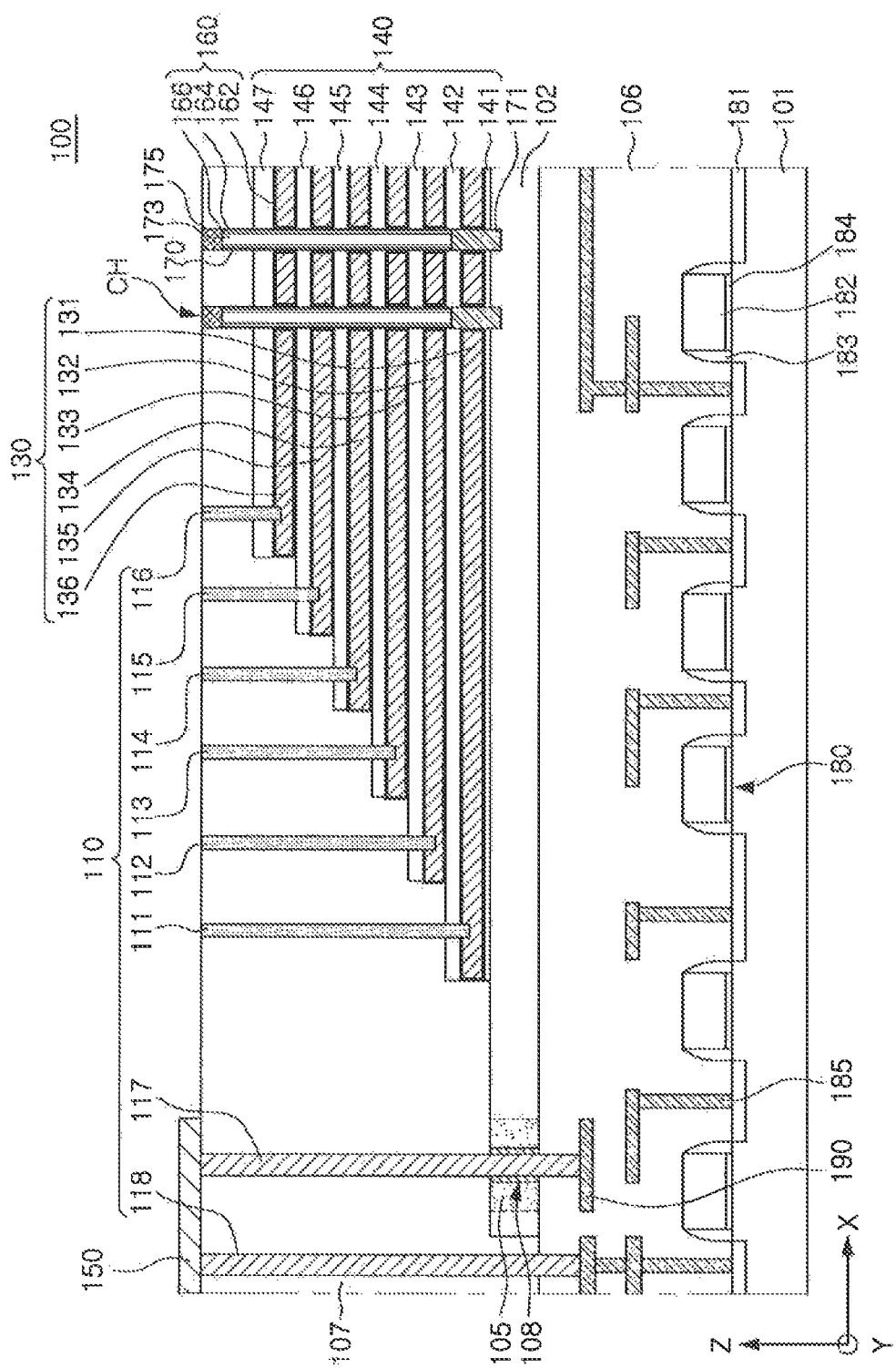
FIG. 4 is a cross-sectional view taken along line I-I' of the memory device illustrated in FIG. 3 according to an exemplary embodiment of the present inventive concept.

FIG. 4 is a cross-sectional view taken along line I-I' of the memory device 100 illustrated in FIG. 3 according to an exemplary embodiment of the present inventive concept. FIG. 5 is a perspective view of a region A of the memory device 100 illustrated in FIG. 3 according to an exemplary embodiment of the present inventive concept. As illustrated in FIG. 5, a second insulating layer 107 may be removed to make it easier to describe a structure and an arrangement of the contacts 110.

The memory device 100 of the present embodiment may have a cell-on-peri (COP) structure. Referring to FIGS. 4 and 5, a cell region C having a plurality of gate electrode layers 131 to 136 (e.g., generally denoted as 130), channel regions CH, and the like, may be provided on a peripheral region P having a plurality of circuit elements 180. The peripheral region P may include a first substrate 101, the cell region C may include a second substrate 102, and the first and second substrates 101 and 102 may be provided as different additional substrates.

The first substrate 101 may be a monocrystalline silicon substrate, and the second substrate 102 may be a polycrystalline silicon substrate. The second substrate 102 may be be formed on a first insulating layer 106 unlike the first substrate 101 may be a monocrystalline silicon substrate, and may include polycrystalline silicon. To increase crystallinity of the second substrate 102, at least a region of the first substrate 101 may extend in the Z-axis direction to contact a lower surface of the second substrate 102, thereby crystallizing the second substrate 102. In addition, a method of growing the second substrate 102 may be used. This may be accomplished, for example, by forming a certain polycrystalline silicon region on the first insulating layer 106 and by using the formed polycrystalline silicon region as a seed layer. The polycrystalline silicon region used as the seed layer may be provided on an upper surface of the first insulating layer 106, or may be provided in a certain groove pattern formed on the first insulating layer 106 and extending in a particular direction.

The peripheral region P may include the first substrate 101, the plurality of circuit elements 180, the first insulating layer 106, and the like. In an exemplary embodiment of the present inventive concept, the circuit elements 180 may include a planar transistor. Referring to FIGS. 4 and 5, each of the circuit elements 180 may have a source/drain region 181, a planar gate electrode 182, a planar gate spacer film 183, and a planar gate insulating layer 184. The circuit elements 180 may have the first insulating layer 106 provided thereon, and the first insulating layer 106 may have a wiring pattern 185 and a protective layer 190 provided therein. In addition, the wiring pattern 185 may be connected to the planar gate electrode 182 or the source/drain region 181. The protective layer 190 may contain a metallic material similar to that involved in the wiring pattern 185, or may contain a selected material having a certain etch selectivity with a material contained in the first insulating layer 106.

The cell region C may be disposed on the peripheral region P. Referring to FIGS. 4 and 5, the second substrate 102 included in the cell region C may be disposed on the upper surface of the first insulating layer 106 included in the peripheral region P. The channel regions CH may be provided in a direction perpendicular to an upper surface of the second substrate 102. Further, the plurality of gate electrode layers 130 may be stacked on the upper surface of the second substrate 102 and adjacent to the channel regions CH. A plurality of interlayer insulating layers 141 to 147 (e.g., generally denoted as 140) may be disposed between the gate electrode layers 130. Further, the plurality of gate electrode layers 130 may extend to have different lengths in the first direction (e.g., the X-axis direction), respectively, to form a stepped structure in a region of the second substrate 102. In the region in which the stepped structure is provided, the plurality of gate electrode layers 131 to 136 may be connected to the plurality of first contacts 111 to 116, respectively. The plurality of interlayer insulating layers 140 may extend in the first direction (e.g., the X-axis direction) and have a length similar to that of their adjacent gate electrode layer 130. In addition, the second insulating layer 107 may be disposed on the plurality of gate electrode layers 131 to 136. Similar to the first interlayer insulating layer 141, the second insulating layer 107 may include silicon oxide, and may include a high deposition of plasma (HDP) oxide film or a tetra-ethyl-ortho-silicate (TEOS) oxide film.

Each of the channel regions CH may include a channel layer 170, gate insulating layers 160 disposed between the channel layer 170 and the plurality of gate electrode layers 130, an embedded insulating layer 173 provided in the channel layer 170, a drain region 175 disposed on the channel layer 170, and an epitaxial layer 171. The embedded insulating layer 173 may fill an annular space formed in the channel layer 170. In an exemplary embodiment of the present inventive concept, the channel layer 170 may have a columnar shape such as a cylinder or a prism. Each of the channel regions CH may have an inclined side surface narrowing toward the upper surface of the second substrate 102 depending on an aspect ratios of the channel regions CH. In addition, the drain region 175 may contain doped polycrystalline silicon.

The channel layer 170 may be connected to the second substrate 102 by the epitaxial layer 171 formed between the second substrate 102 and a lower surface of the channel layer 170. The channel layer 170 may contain a semiconductor material, such as polycrystalline silicon or monocrystalline silicon, and the semiconductor material may be a material not doped with an impurity or a material doped with a p- or n-type impurity. The epitaxial layer 171 may be grown by performing a selective epitaxial growth (SEG) process.

Figure 5:
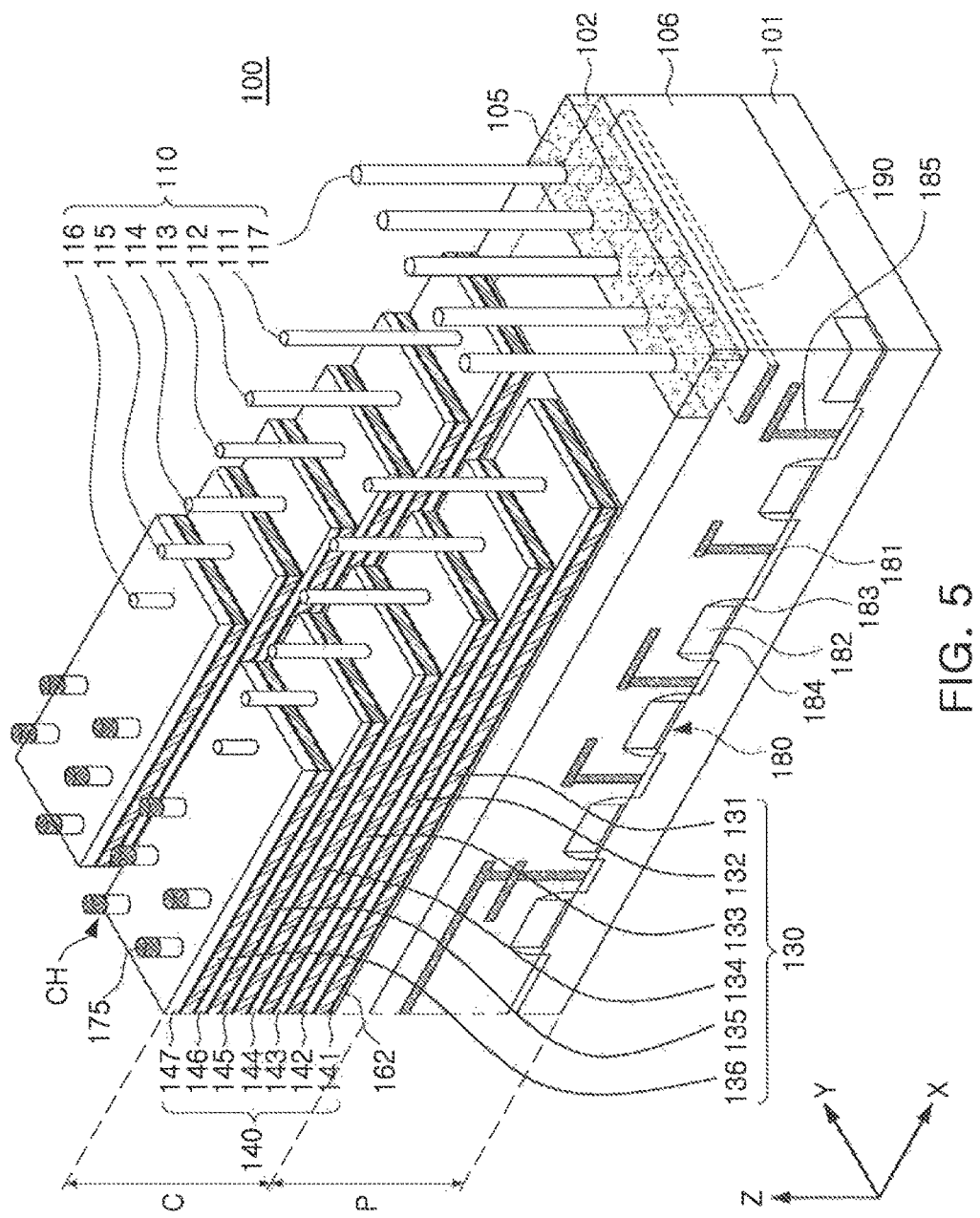
FIG. 5 is a partial perspective view of a region A of the memory device illustrated in FIG. 3 according to an exemplary embodiment of the present inventive concept.

As illustrated in FIGS. 4 and 5, the contacts 110 may be connected to at least one of the plurality of gate electrode layers 130, the second substrate 102, or the plurality of circuit elements 180. For example, to form the plurality of contacts 110, a region of the second insulating layer 107 may be selectively removed to form a plurality of vertical openings extending in the direction (e.g., the Z-axis direction) perpendicular to the upper surface of the second substrate 102, and the plurality of vertical openings may be filled with a conductive material. In this case, the metallic material contained in the gate electrode layer 130, or in the wiring pattern 185 formed in the first insulating layer 106 may have a certain etch selectivity with an insulating material contained in the first or second insulating layer 106 or 107.

Further, the second substrate 102 may contain a semiconductor material, such as polycrystalline silicon, and may thus have a relatively low etch selectivity in comparison to the metallic material. Therefore, in a process of providing vertical openings to form the first contacts 117 connected to the second substrate 102, the first contacts 117 may pass through the second substrate 102 to be connected to the circuit elements 180 or the wiring pattern 185 positioned in the peripheral region P. However, this may reduce reliability of the memory device 100. To increase the reliability of the memory device 100, a method of forming the first contacts 117 in an additional process independent of a process of forming the second contacts 111 to 116 or the third contacts 118 may be used. In this case, however, the number of processes may be increased.

In an exemplary embodiment of the present inventive concept, the protective layer 190 may be disposed below a region of the second substrate 102 connected to the first contacts 117. The protective layer 190 may contain a material having a certain etch selectivity as compared to the first and second insulating layers 106 and 107. In an exemplary embodiment of the present inventive, in a case in which the first and second insulating layers 106 and 107 are silicon oxide films, the protective layer 190 may contain a silicon nitride film. In another exemplary embodiment of the present inventive concept, the protective layer 190 may contain a metallic material, and may also be formed with the wiring pattern 185.

In the process of providing the vertical openings to form the first contacts 117, even when the vertical openings are excessively etched to pass through the second substrate 102, the protective layer 190 positioned below the second substrate 102 may cause the vertical openings not to extend up to the wiring pattern 185 or the circuit elements 180 positioned in the peripheral region P. For example, the protective layer 190 may protect the memory device 100 from a short circuit that may occur when the first contacts 117 are connected to other elements, such as a portion of the wiring pattern 185 or the circuit elements 180 provided in the first insulating layer 106, other than the second substrate 102.

The first contacts 117 may be connected to the second substrate 102 in a first impurity region 105 doped with an impurity. The first contacts 117 may be connected to the third contacts 118 connected to at least one of the plurality of circuit elements 180 through a metal layer 150 on an upper portion of the cell region C. When a certain level of voltage is applied to the first impurity region 105 of the second substrate 102 through the first contacts 117, data stored in memory cells may be deleted. It is to be understood that the memory cells may be provided by the channel regions CH and the plurality of gate electrode layers 130. In an exemplary embodiment of the present inventive concept, the first impurity region 105 may be doped with a p-type impurity. Except for the first impurity region 105, the remaining region of the second substrate 102 may not be doped with an impurity, or may be doped with a p-type impurity having a lower concentration than that of the first impurity region 105. A region of the second substrate 102 may also contain an n-type impurity below the common source lines 103.

In addition, barrier layers 108 may be provided between the first contacts 117 and the first impurity region 105. The barrier layers 108 may separate the first contacts 117 from the first impurity region 105. The barrier layers 108 may contain a conductive metallic material, such as tantalum (Ta) or titanium nitride (TiN). The barrier layers 108 may prevent the first contacts 117 from being contaminated by the p-type impurity material or the like included in the first impurity region 105.

In the present embodiment illustrated in FIG. 5, the protective layer 190 may extend in the second direction (e.g., the Y-axis direction), and may be disposed below the plurality of first contacts 117. The first impurity region 105 disposed above the protective layer 190 may also have a shape extending in the second direction (e.g., the Y-axis direction). In an exemplary embodiment of the present inventive concept, on the X-Y plane of the memory device 100, the first impurity region 105 may have a shape surrounding the channel layers 170, the plurality of gate electrode layers 130, and the like. In addition, the protective layer 190 may have a shape corresponding to the first impurity region 105.

Referring to the exemplary embodiments of the present inventive concept illustrated in FIGS. 4 and 5, the plurality of gate electrode layers 130 may be alternately stacked with the plurality of interlayer insulating layers 140 in the Z-axis direction. Each of the plurality of gate electrode layers 130 may be disposed adjacent to at least one of the channel layers 170, and may be used to form gate electrodes each including a ground select transistor GST, a plurality of memory cell transistors MC1 to MCn, and a string select transistor SST. The plurality of gate electrode layers 130 may be extended while forming word lines WL1 to WLn, and may be commonly connected to adjacent memory cell strings of predetermined units arranged in the first direction (e.g., the X-axis direction) and the second direction (e.g., the Y-axis direction). In an exemplary embodiment of the present inventive concept, the total number of the gate electrode layers 130 forming the memory cell transistors MC1 to MCn may be $2^N$ (in which N is a positive integer).

The gate electrode layer 131 of the ground select transistor GST may be connected to a ground select line GSL. FIGS. 4 and 5 illustrate a single gate electrode layer 136 of the string select transistor SST and a single gate electrode layer 131 of the ground select transistor GST, respectively, but the number of each of the gate electrode layer 136 and the gate electrode layer 131 is not limited to one. In addition, the gate electrode layer 136 of the string select transistor SST and the gate electrode layer 131 of the ground select transistor GST may have a structure different from that of the gate electrode layers 132 to 135 of the memory cell transistors MC1 to MCn.

The plurality of gate electrode layers 130 may contain a polycrystalline silicon material or a metallic silicide material. The metallic silicide material may be, for example, a silicide material including a metal selected from cobalt (Co), nickel (Ni), hafnium (Hf), platinum (Pt), tungsten (W), and titanium (Ti). According to an exemplary embodiment of the present inventive concept, the plurality of gate electrode layers 130 may also contain a metallic material such as tungsten (W). In addition, the plurality of gate electrode layers 130 may further include a diffusion barrier, and the diffusion barrier may contain, for example, at least one of tungsten nitride (WN), tantalum nitride (TaN), and titanium nitride (TiN).

The plurality of gate electrode layers 130 may be alternately stacked with the plurality of interlayer insulating layers 140. For example, a first gate electrode layer 131 may be disposed above an interlayer insulating layer 141, and an interlayer insulating layer 142 may be disposed above the first gate electrode layer 131, and so on. Further, the plurality of interlayer insulating layers 140 may be separated from each other by the isolation insulating layers 104 in the Y-axis direction like the plurality of gate electrode layers 130. The interlayer insulating layers 141 to 147 may extend to have different lengths, respectively, to form a stepped structure. The plurality of interlayer insulating layers 140 may contain an insulating material, such as silicon oxide or silicon nitride.

The gate insulating layers 160 may be disposed between the channel layers 170 and the plurality of gate electrode layers 130. Each of the gate insulating layers 160 may include a blocking layer 162, an electric charge storage layer 164, and a tunneling layer 166 sequentially stacked between the channel layers 170 and the gate electrode layers 130. The blocking layer 162 may contain a high dielectric (high-k) material. In this case, the high dielectric (high-k) material may be defined as a dielectric material having a higher dielectric constant than that of a silicon oxide film. The tunneling layer 166 may allow electric charges to be transmitted to the electric charge storage layer 164 in a Fowler-Nordheim (F-N) tunneling manner. The tunneling layer 166 may contain, for example, silicon oxide. The electric charge storage layer 164 may be an electric charge trap layer or a conductive floating gate layer. For example, the electric charge storage layer 164 may contain a dielectric material, quantum dots, or nanocrystals. In this case, the quantum dots or the nanocrystals may include an electric conductor, for example, micro-particles of a metal or a semiconductor.

Figure 6:
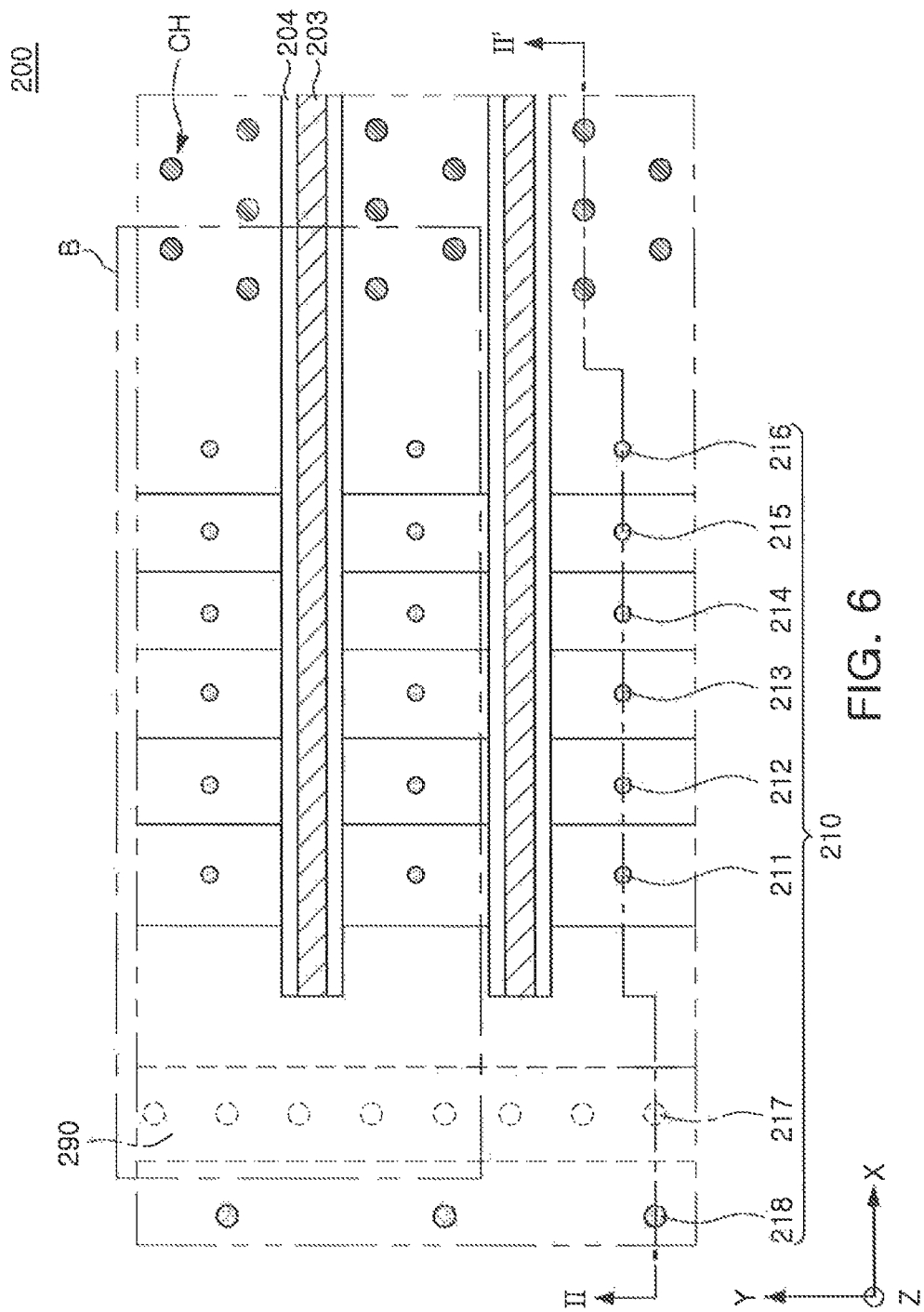
FIG. 6 is a plan view of a memory device according to an exemplary embodiment of the present inventive concept.

FIG. 6 is a plan view of a memory device 200 according to an exemplary embodiment of the present inventive concept.

Referring to FIG. 6, a memory device 200 according to an exemplary embodiment of the present inventive concept may include channel regions CH, first contacts 217 connected to a substrate, a plurality of second contacts 211 to 216 connected to a plurality of gate electrode layers stacked on the substrate and be adjacent to the channel regions CH, third contacts 218 connected to at least one of a plurality of circuit elements, isolation insulating layers 204 for dividing each of the gate electrode layers into a plurality of regions, common source lines 203 respectively included in the isolation insulating layers 204, and the like. The substrate disposed below the common source lines 203 may contain an n-type impurity, and may contain a p-type impurity in a region in which the substrate is connected to the first contacts 217. A configuration of the channel regions CH, the first to third contacts 211 to 218, which are collectively represented by a contact 210, the gate electrode layers, and the like, may be similar to the corresponding configurations of the memory device 100 according to the exemplary embodiment of the present inventive concept illustrated in FIG. 3.

The memory device 200 according to the exemplary embodiment of the present inventive concept will hereinafter be described with reference to FIGS. 7 and 8.

Figure 7:
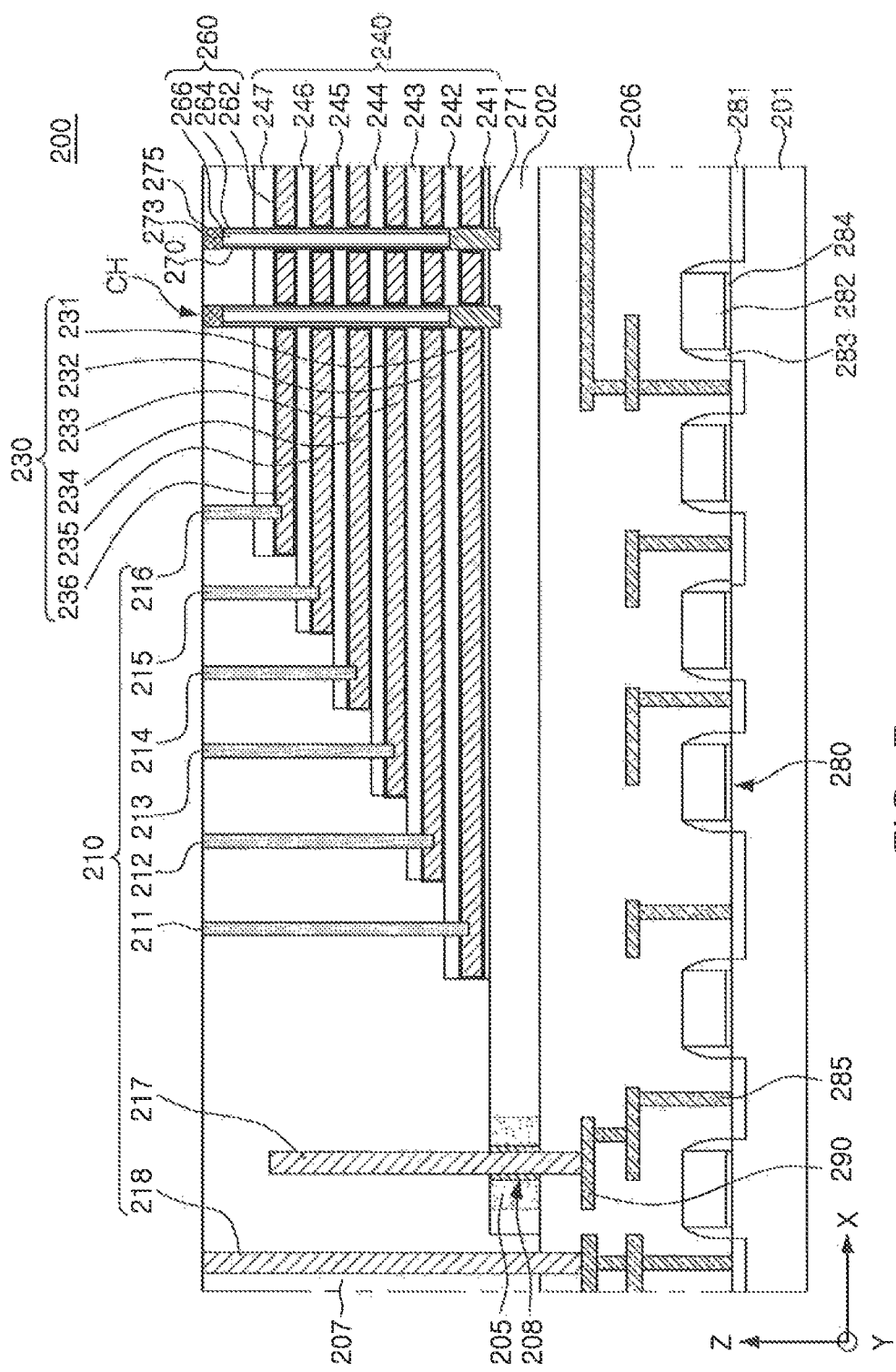
FIG. 7 is a cross-sectional view taken along line II-II' of the memory device illustrated in FIG. 6 according to an exemplary embodiment of the present inventive concept.

FIG. 7 is a cross-sectional view taken along line II-II' of the memory device 200 illustrated in FIG. 6 according to an exemplary embodiment of the present inventive concept. FIG. 8 is a perspective view of a region B of the memory device 200 illustrated in FIG. 6 according to an exemplary embodiment of the present inventive concept.

Figure 8:
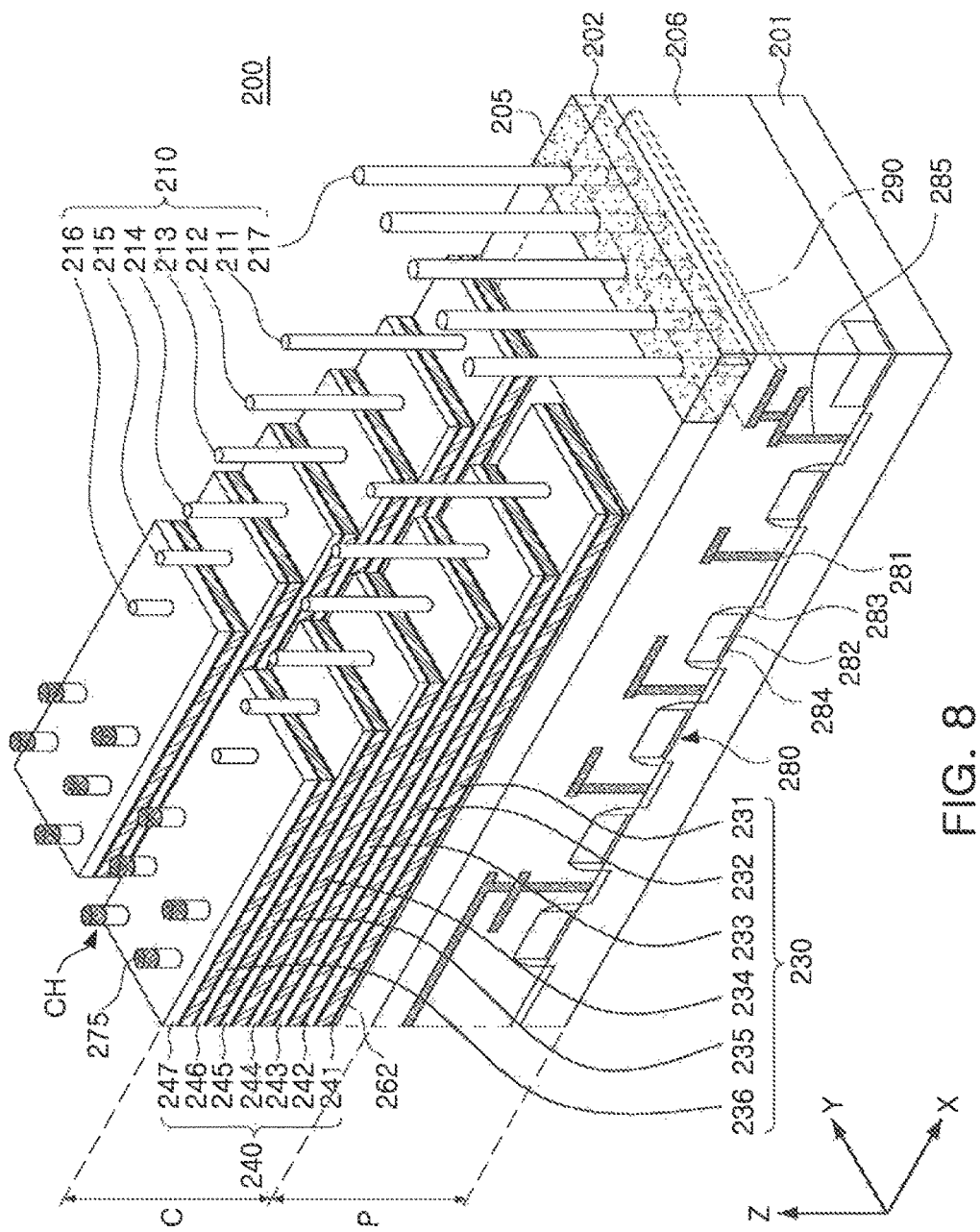
FIG. 8 is a partial perspective view of a region B of the memory device illustrated in FIG. 6 according to an exemplary embodiment of the present inventive concept.

Referring to FIGS. 7 and 8, the memory device 200 according to an exemplary embodiment of the present inventive concept may have a COP structure in which a cell region C is disposed on a peripheral region P having a plurality of circuit elements 280. The peripheral region P and the cell region C may include a first substrate 201 and a second substrate 202, respectively. The first substrate 201 may have the plurality of circuit elements 280 disposed thereon. The second substrate 202 may have channel regions CH, a plurality of gate electrode layers 231 to 236 (e.g., generally denoted as 230), a plurality of interlayer insulating layers 241 to 247 (e.g., generally denoted as 240), first to third contacts 211 to 218 (e.g., generally denoted as 210), and the like, disposed on the second substrate 202. Further, the plurality of gate electrode layers 230 may be stacked on the second substrate 202 and adjacent to the channel regions CH. The channel regions CH and the plurality of gate electrode layers 230 may form a plurality of memory cell devices in the cell region C.

The plurality of gate electrode layers 230 and the plurality of interlayer insulating layers 240 may be alternately stacked on an upper surface of the second substrate 202. The gate electrode layers 231 to 236 and the interlayer insulating layers 241 to 247 may extend to have different lengths, respectively, to form a stepped structure. The plurality of gate electrode layers 230 may be connected to the plurality of second contacts 211 to 216 in a region in which the stepped structure is formed. The plurality of interlayer insulating layers 240 may extend in the first direction by a length substantially identical to that of the plurality of gate electrode layers 230 adjacent thereto.

Each of the circuit elements 280 disposed on the first substrate 201 in the peripheral region P may be a planar transistor, and may include a source/drain region 281, a planar gate electrode 282, a planar gate spacer film 283, a planar gate insulating layer 284, and the like. The source/drain region 281, the planar gate electrode 282, and the like included in each of the circuit elements 280 may be electrically connected to a wiring pattern 285 provided in a first insulating layer 206.

The channel regions CH may pass through the plurality of gate electrode layers 230. Therefore, channel layers 270 extending in a Z-axis direction may be disposed adjacently to the plurality of gate electrode layers 230 with a plurality of gate insulating layers 260 interposed between the channel layers 270 and the plurality of gate electrode layers 230. Each of the plurality of gate insulating layers 260 may include a blocking layer 262, an electric charge storage layer 264, a tunneling layer 266, and the like. An internal space of each of the channel layers 270 may be filled with an embedded insulating layer 273, and an epitaxial layer 271 may be provided between the second substrate 202 and each of the channel layers 270.

The plurality of contacts 210 may include the first contacts 217, the second contacts 211 to 216, the third contacts 218, and the like. The plurality of second contacts 211 to 216 may be connected to the plurality of gate electrode layers 230, respectively. The first contacts 217 may be connected to the second substrate 202 in a first impurity region 205. In addition, the third contacts 218 may pass through the first insulating layer 206 to be connected to the wiring pattern 285 or the circuit elements 280 disposed in the peripheral region P.

In the exemplary embodiments of the present inventive concept illustrated in FIGS. 7 and 8, the first contacts 217 may pass through the first impurity region 205 and be connected to a protective layer 290 below the second substrate 202 and in the first insulating layer 206. In addition, compared to the exemplary embodiments of the present inventive concept illustrated in FIGS. 4 through 6, the first contacts 217 may not extend up to an upper surface of a second insulating layer 207, and may be connected to at least one of the circuit elements 280 or the wiring pattern 285 of the peripheral region P through the protective layer 290 below the second substrate 202 and in the first insulating layer 206. The protective layer 290 may have a shape corresponding to that of the first impurity region 205. The first contacts 217 may be disposed on an upper surface of the protective layer 290 to pass through the first impurity region 205.

For example, the first contacts 217 may receive a certain voltage signal from the circuit elements 280 of the peripheral region P through the protective layer 290. The voltage signal received by the first contacts 217 may allow data stored in the memory cell devices of the cell region C to be deleted. As described above, to supply a voltage signal to the second substrate 202 through the first contacts 217, the protective layer 290 may be formed of a conductive material, such as a metallic material similar to that included in the wiring pattern 285. The protective layer 290 may be formed along with the wiring pattern 285 using a substantially identical process.

The first contacts 217 may be connected to the circuit elements 280 or the wiring pattern 285 through the protective layer 290 disposed below the second substrate 202 and in the first insulating layer 206, and a portion of a metal layer disposed on an upper portion of the second insulating layer 207 may thus be removed. Therefore, a degree of integration of the memory device 200 may be increased.

Figure 9:
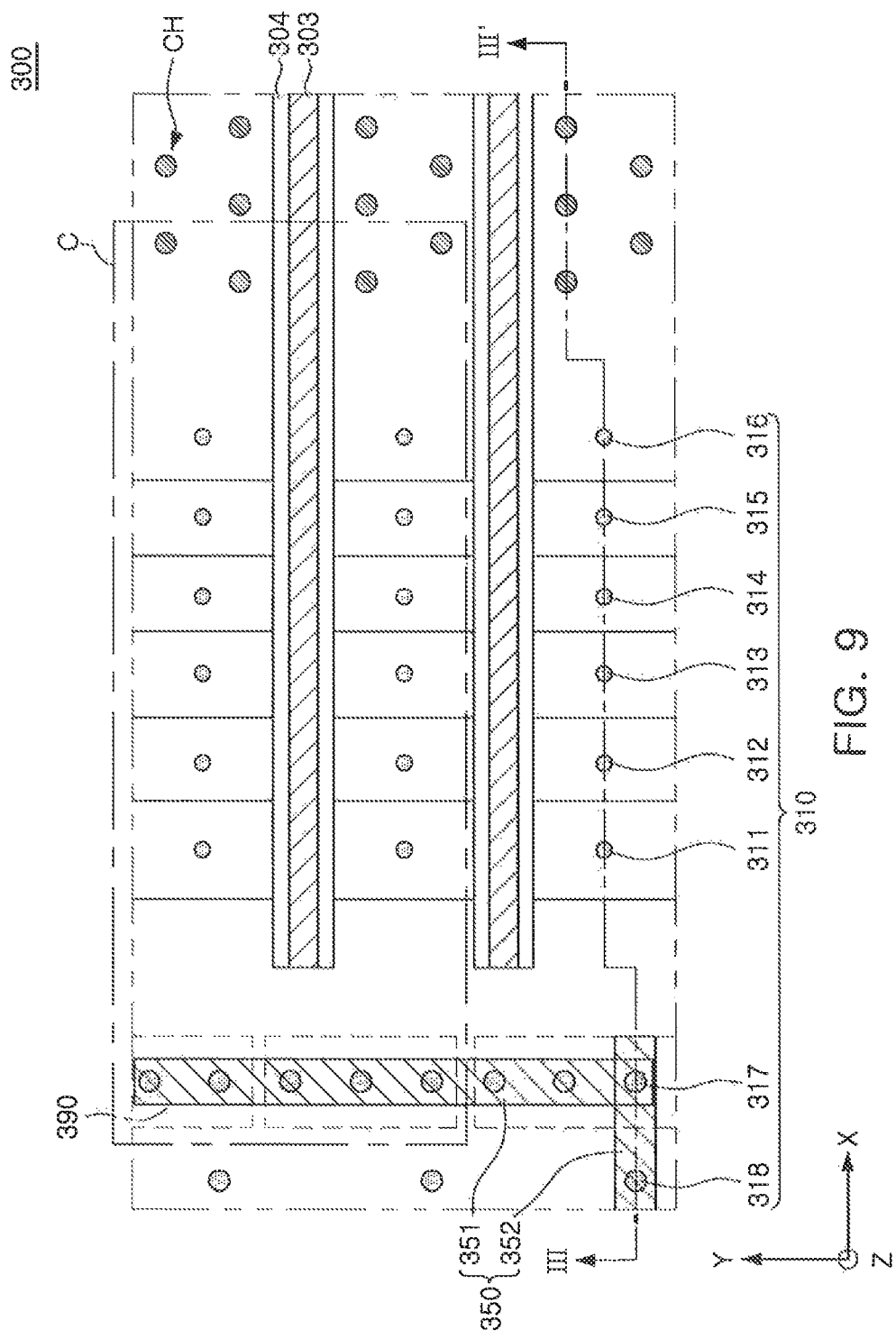
FIG. 9 is a plan view of a memory device according to an exemplary embodiment of the present inventive concept.

FIG. 9 is a plan view of a memory device according to an exemplary embodiment of the present inventive concept.

Referring to FIG. 9, a memory device 300 according to an exemplary embodiment of the present inventive concept may include channel regions CH, a plurality of contacts 311 to 318 (e.g., generally denoted as 310), isolation insulating layers 304 and common source lines 303 for dividing a plurality of gate electrode layers into a plurality of unit cell regions, and the like. The plurality of gate electrode layers may extend to have different lengths in a first direction (e.g., the X-axis direction) to be connected to the plurality of second contacts 311 to 316, respectively. A protective layer 390 may be provided below the first contacts 317 connected to a substrate on which the plurality of gate electrode layers are disposed. When the first contacts 317 pass through the substrate, the protective layer 390 may protect the memory device 300 from a short circuit that may occur when the first contacts 317 are electrically connected to other circuit elements below the substrate.

Figure 10:
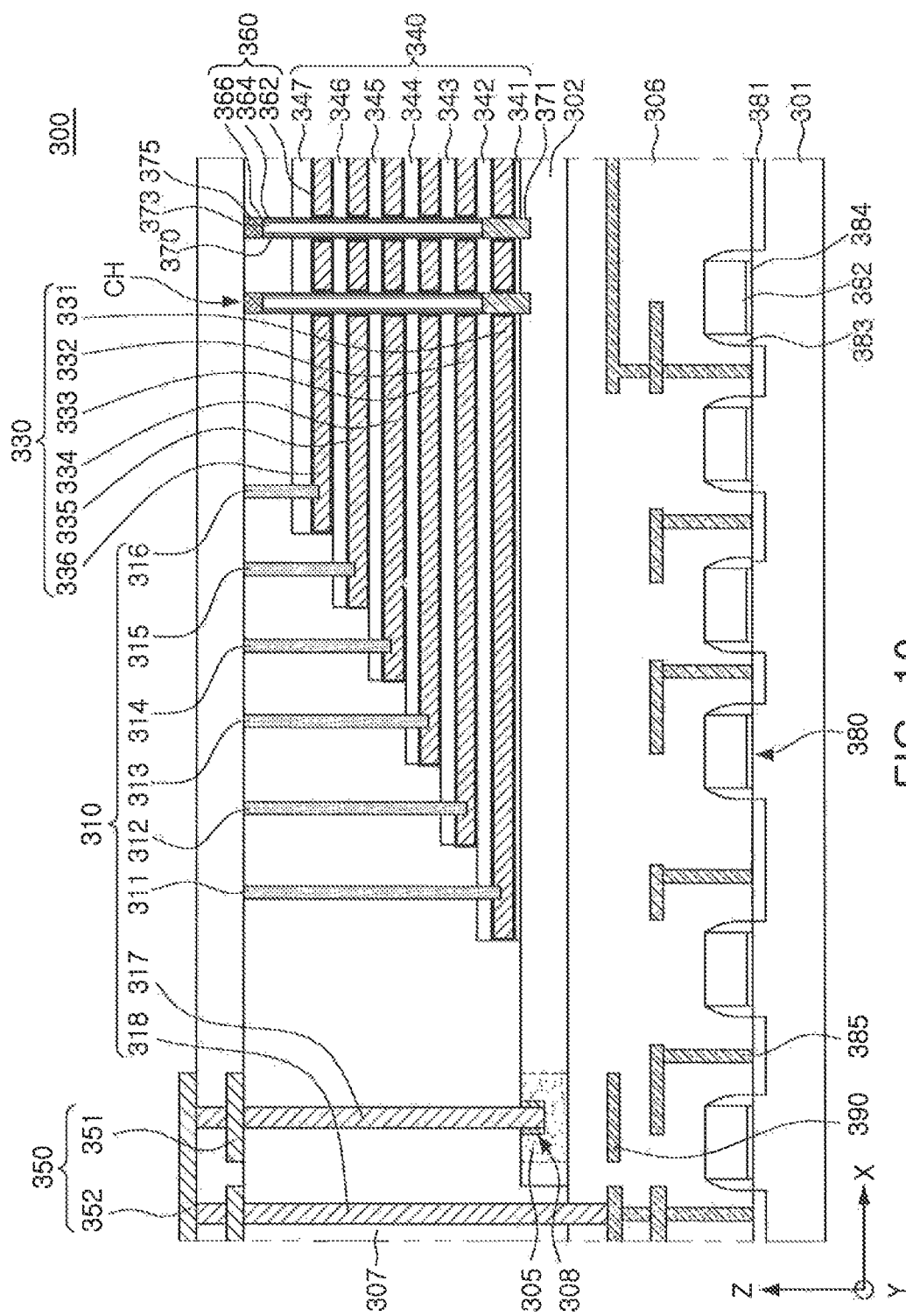
FIG. 10 is a cross-sectional view taken along line III-III' of the memory device illustrated in FIG. 9 according to an exemplary embodiment of the present inventive concept.
Figure 11:
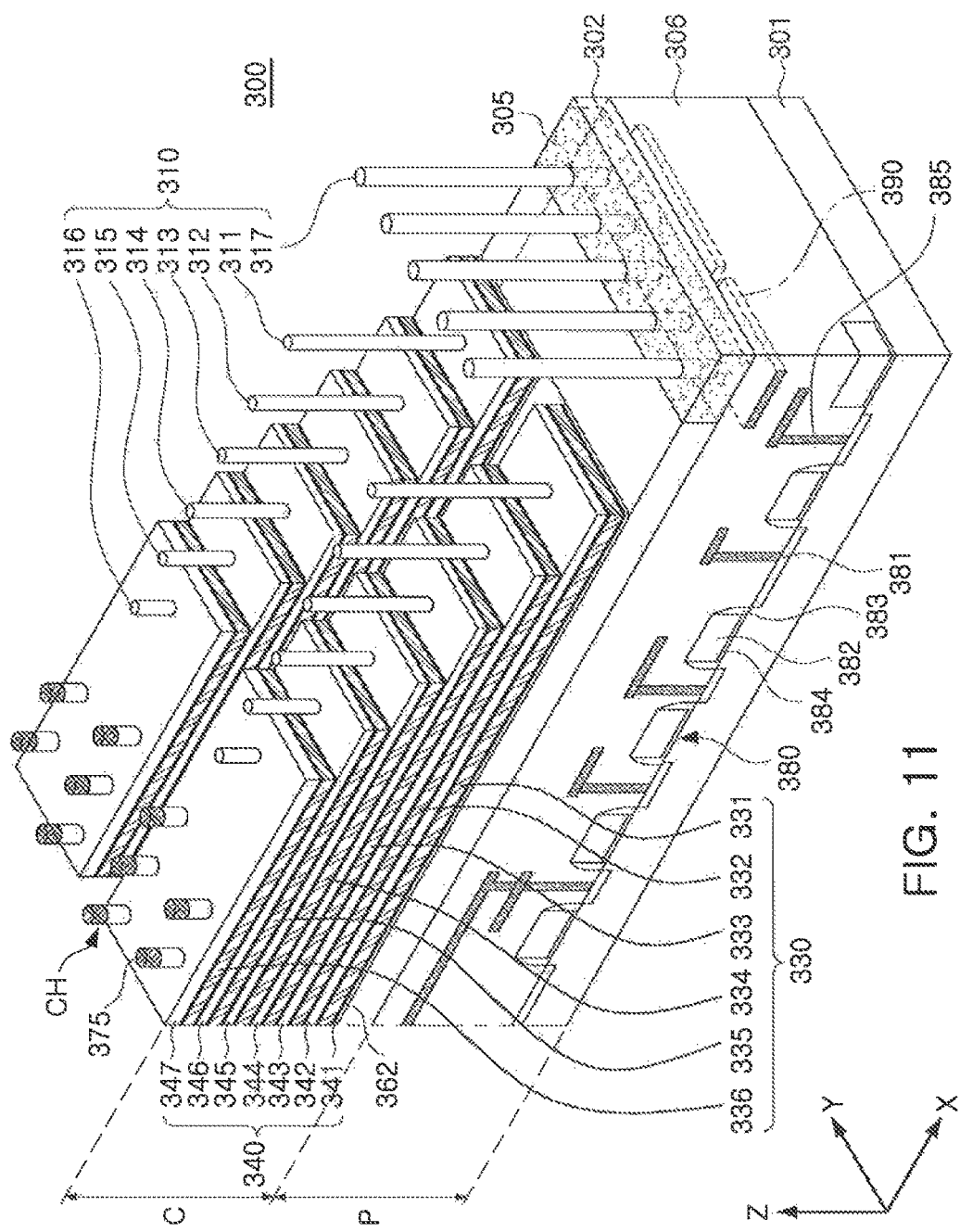
FIG. 11 is a partial perspective view of a region C of the memory device illustrated in FIG. 9 according to an exemplary embodiment of the present inventive concept.

FIG. 10 is a cross-sectional view taken along line III-III' of the memory device 300 illustrated in FIG. 9 according to an exemplary embodiment of the present inventive concept. FIG. 11 is a perspective view of a region C of the memory device 300 illustrated in FIG. 9 according to an exemplary embodiment of the present inventive concept.

First, referring to FIG. 10, the memory device 300 according to an exemplary embodiment of the present inventive concept may have a COP structure in which a cell region C is disposed on a peripheral region P. The peripheral region P may include a first substrate 301, and the first substrate 301 may include a plurality of circuit elements 380 and a first insulating layer 306 disposed thereon. The first substrate 301 may be, for example, a monocrystalline silicon substrate. Each of the circuit elements 380 may include a source/drain region 381, a planar gate electrode 382, a planar gate spacer film 383, a planar gate insulating layer 384, and the like, and may be electrically connected to a wiring pattern 385.

The first insulating layer 306 may have a second substrate 302 disposed on an upper surface thereof. The second substrate 302 may be, for example, a polycrystalline silicon substrate. Further, a region of the second substrate 302 may be doped with a p-type impurity to be provided as a first impurity region 305. The first impurity region 305 may be provided as a pocket P-well (PPW) region, and may be connected to the first contacts 317 to receive a voltage signal.

In addition, the protective layer 390 may be disposed below the first impurity region 305. The protective layer 390 may be provided to prevent the first contacts 317 from being unintentionally connected to the circuit elements 380 or the wiring pattern 385 disposed below the second substrate 302 by passing through the second substrate 302. The exemplary embodiments of the present inventive concept illustrated in FIGS. 10 and 11 illustrate the first contacts 317 not passing through the second substrate 302, but are not limited thereto. For example, in a process of providing vertical openings to form the first contacts 317, the protective layer 390 may be provided to prevent the first contacts 317 from being connected to the circuit elements 380 or the wiring pattern 385 due to excessive etching of the vertical openings which came the second substrate 302 to be penetrated by the first contacts 317 that extend into the first insulating layer 306.

The cell region C may include a plurality of gate electrode layers 330, and a plurality of interlayer insulating layers 340. The plurality of gate electrode layers 331 to 336 and the plurality of interlayer insulating layers 341 to 347 may be alternately stacked on each other on the second substrate 302. For example, a first gate electrode layer 131 may be disposed above an interlayer insulating layer 141, and an interlayer insulating layer 142 may be disposed above the first gate electrode layer 131, and so on. The plurality of gate electrode layers 331 to 336 and the plurality of interlayer insulating layers 341 to 347 may extend in a first direction (e.g., the X-axis direction) to have different lengths, respectively, forming a stepped structure. In a region in which the stepped structure is formed, the plurality of second contacts 311 to 316 may be connected to the plurality of gate electrode layers 331 to 336, respectively. The channel regions CH and the plurality of gate electrode layers 331 to 336 may form a plurality of memory cell devices.

Each of the channel regions CHs may include a channel layer 370, an embedded insulating layer 373, a drain region 375, and an epitaxial layer 371. The drain region 375 may or may not include polycrystalline silicon containing an impurity, and the epitaxial layer 371 may be grown from the second substrate 302 using, for example, an SEG process. Gate insulating layers 360 may be provided between the channel layers 370 and the gate electrode layers 331 to 336. Each of the gate insulating layers 360 may include a blocking layer 362, an electric charge storage layer 364, a tunneling layer 366, and the like. The blocking layer 362 may be disposed to surround each of the gate electrode layers 331 to 336.

In the exemplary embodiments of the present inventive concept illustrated in FIGS. 10 and 11, the protective layer 390 may include a plurality of regions separated from each other below the first impurity region 305. To effectively supply a voltage signal for a data erase operation to the first impurity region 305 provided as the PPW region, the plurality of first contacts 317 may be electrically connected to each other by a first metal layer 351 on an upper portion of a second insulating layer 307. Referring to FIG. 10, the plurality of first contacts 317 may be electrically connected to each other by the first metal layer 351 extending in a Y-axis direction, and at least a portion of the plurality of circuit elements 380 and the first contacts 317 may be electrically connected to each other by a second metal layer 352 disposed on the first metal layer 351.

Figure 12B:
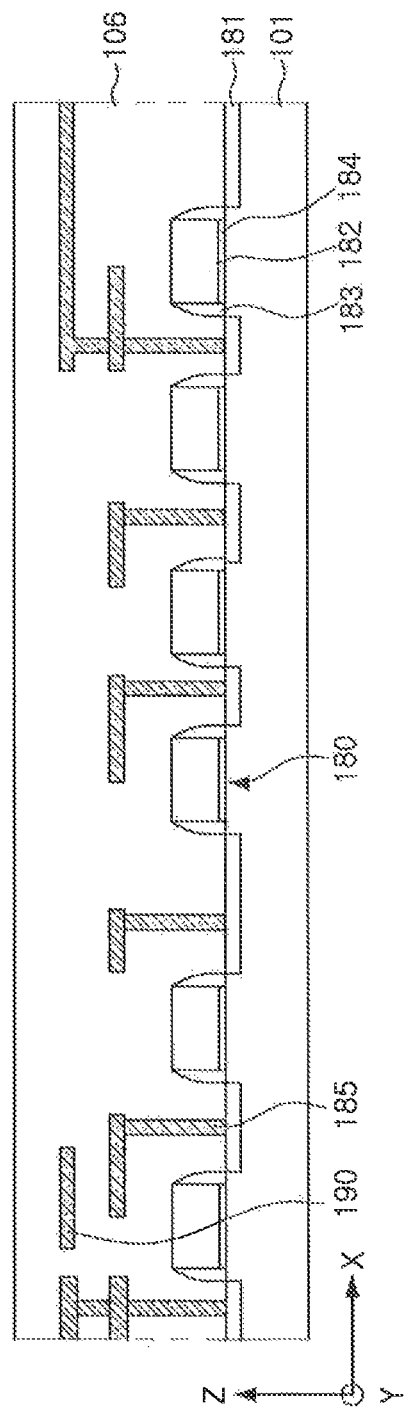

FIGS. 12A through 24B are views of methods of manufacturing the memory devices illustrated in FIGS. 3 through 6, respectively, according to an exemplary embodiment of the present inventive concept. FIG. 12B is a cross-sectional view taken along line I-I' of FIG. 12A according to an exemplary embodiment of the present inventive concept.

First, referring to FIGS. 12A and 12B, the plurality of circuit elements 180 and the first insulating layer 106 may be formed on the first substrate 101. The first substrate 101 may contain a semiconductor material. In an exemplary embodiment of the present inventive concept, first substrate 101 may be, for example, a monocrystalline silicon substrate. Each of the circuit elements 180 may provide the planar transistors, and may include the source/drain region 181, the planar gate electrode 182, the planar gate spacer film 183, the planar gate insulating layer 184, and the like.

The plurality of circuit elements 180 may be covered with the first insulating layer 106 provided on the first substrate 101. The first insulating layer 106 may contain an insulating material, such as a silicon oxide film or a silicon nitride film. The wiring pattern 185 and the protective layer 190 may be provided in the first insulating layer 106. Further, the wiring pattern 185 may be electrically connected to at least one of the plurality of circuit elements 180. The protective layer 190 may be disposed below the second substrate 102 and provided on the upper surface of the first insulating layer 106, and in particular, may be disposed below a certain impurity region formed on the second substrate 102. The protective layer 190 may be provided in a case in which contacts for supplying a certain electrical signal to the impurity region pass through the second substrate 102, and may have a shape corresponding to the impurity region that will later be formed.

The protective layer 190 may be formed of a material having a predetermined etch selectivity with the first insulating layer 106. For example, when the first insulating layer 106 is a silicon oxide film, the protective layer 190 may include a silicon nitride film. In an exemplary embodiment of the present inventive concept, the protective layer 190 may contain a metallic material like that found in the wiring pattern 185, and may be formed along with the wiring pattern 185 using a substantially identical process.

Figure 13B:
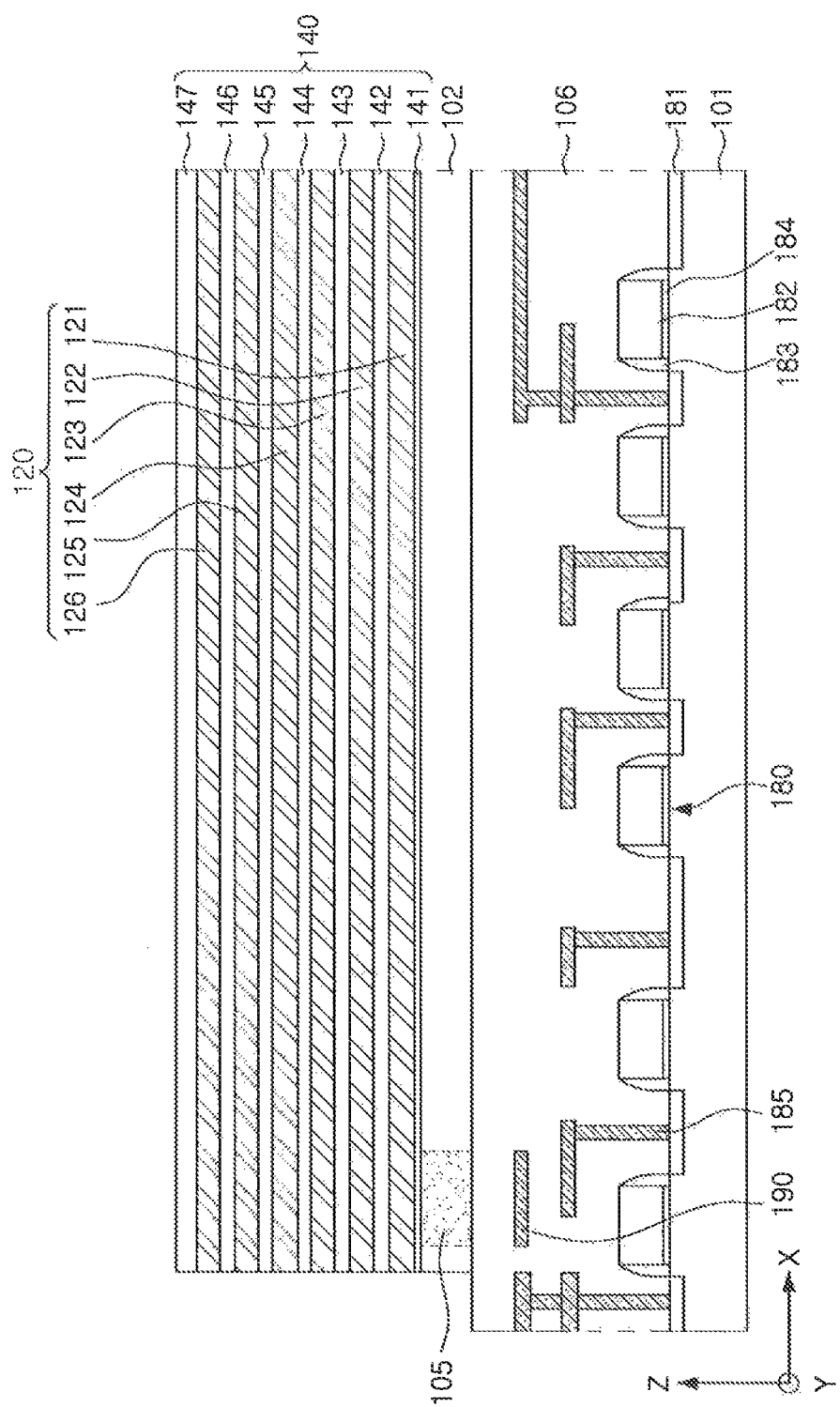

Next, referring to FIGS. 13A and 13B, the second substrate 102 may be formed on the upper surface of the first insulating layer 106, and a plurality of sacrificial layers 121 to 126 (e.g., generally denoted as 120) and the plurality of interlayer insulating layers 141 to 147 (e.g., generally denoted as 140) may be alternately stacked on each other on the second substrate 102. The plurality of sacrificial layers 120 may be formed of a material that may be selectively etched with a high etching selectivity for the plurality of interlayer insulating layers 140. The etch selectivity may be quantitatively represented by a ratio including a rate of etching speed of the plurality of sacrificial layers 120 to a rate of etching speed of the plurality of interlayer insulating layers 140. For example, the plurality of interlayer insulating layers 140 may be at least one of a silicon oxide film and a silicon nitride film. Further, the plurality of sacrificial layers 120 may include a material selected from silicon, silicon oxide, silicon carbide and silicon nitride, and different from that included in the plurality of interlayer insulating layers 140. For example, when the plurality of interlayer insulating layers 140 are a silicon oxide film, the plurality of sacrificial layers 120 may be a silicon nitride film.

Prior to formation of the plurality of sacrificial layers 120 and the plurality of interlayer insulating layers 140, an impurity may be injected onto a region of the second substrate 102 to form the first impurity region 105. The first impurity region 105 may include a p-type impurity, and may have a shape that surrounds the memory cells provided by the channel regions CH and the plurality of gate electrode layers 130 in a subsequent process.

Figure 14A:
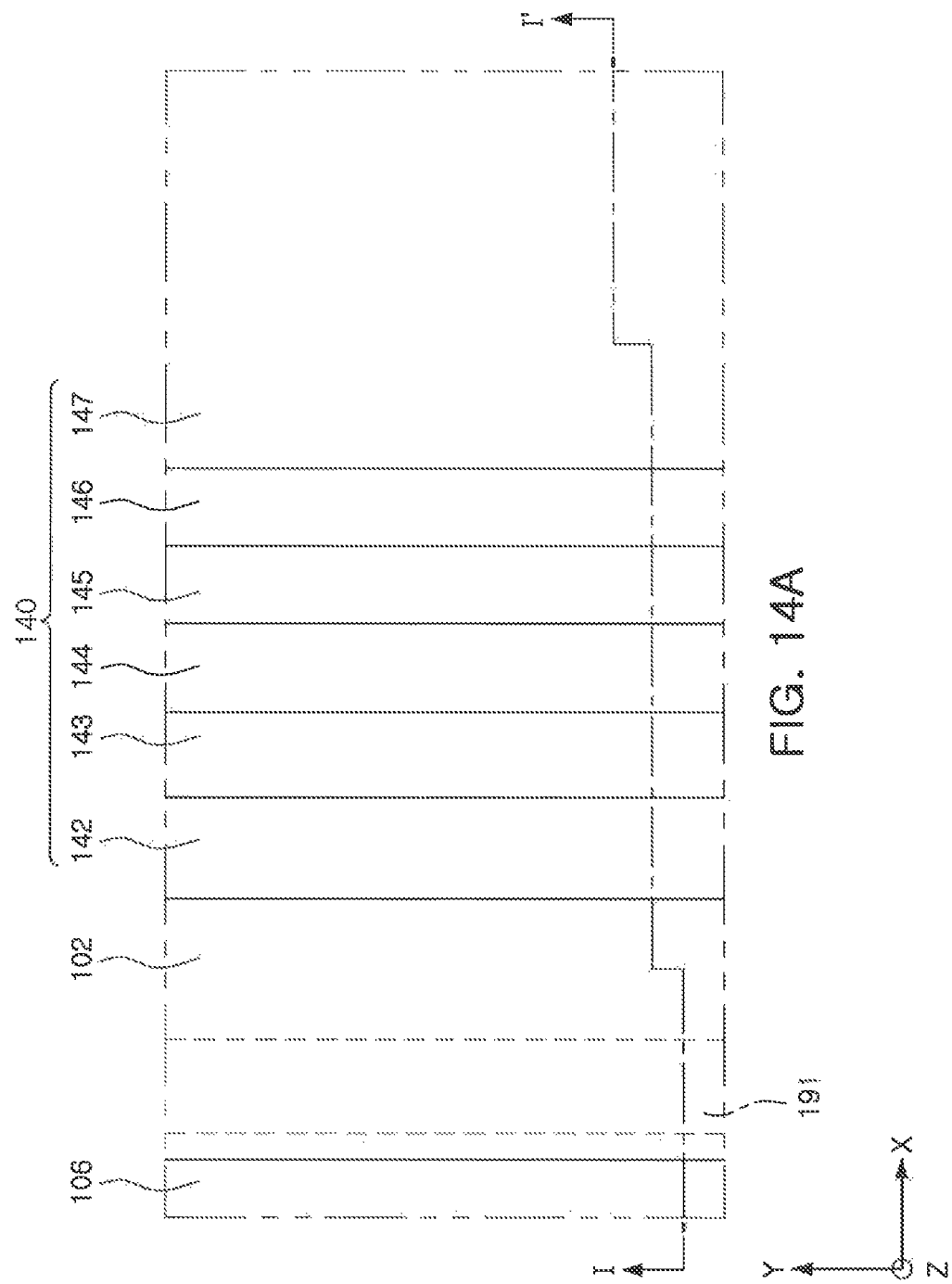
Figure 14B:
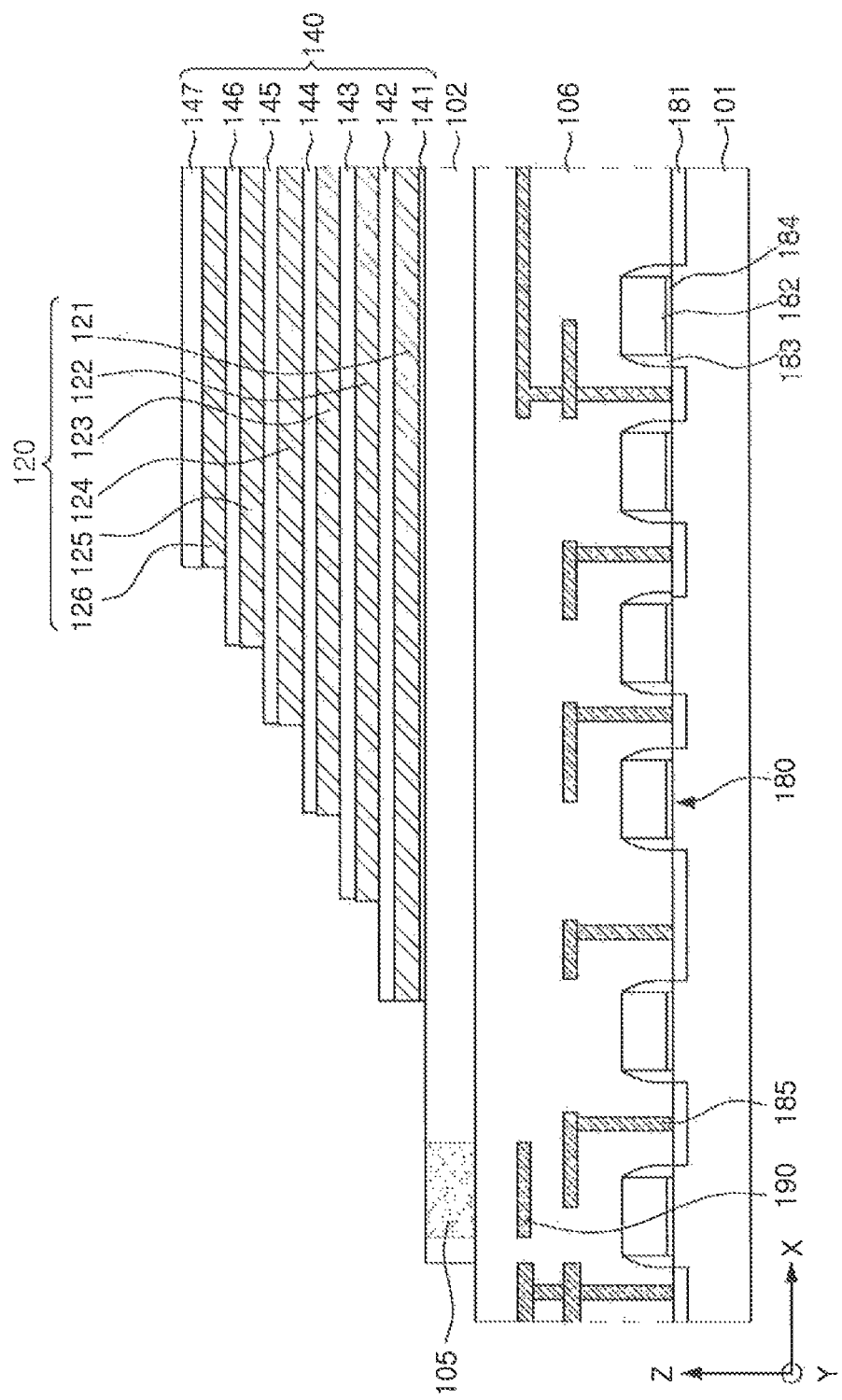

Next, referring to FIGS. 14A and 14B, the sacrificial layer 120 and the interlayer insulating layer 140 may be etched to form the stepped structure. For example, to form the steps between the plurality of sacrificial layers 120 and the plurality of interlayer insulating layers 140 adjacent to each other in the Z-axis direction as shown in FIGS. 14A and 14B, a certain mask layer may be formed on the plurality of sacrificial layers 121 to 126 and the plurality of interlayer insulating layers 141 to 147. Further, the plurality of sacrificial layers 120 and the plurality of interlayer insulating layers 140 exposed by the mask layer may be etched. A process of etching the plurality of sacrificial layers 120 and the plurality of interlayer insulating layers 140 exposed by the mask layer, while trimming the mask layer, may be repeated to sequentially etch the plurality of sacrificial layers 120 and the plurality of interlayer insulating layers 140, thereby forming the stepped structure.

In an exemplary embodiment of the present inventive concept, each of the plurality of interlayer insulating layers 141 to 147 and each of the plurality of sacrificial layers 121 to 126 may form pairs. Further, the plurality of interlayer insulating layers 141 to 147 and the plurality of sacrificial layers 121 to 126 included in the pairs may extend in a direction (e.g., the Y-axis of FIGS. 14A and 14B) to have a substantially identical length, respectively. For example, the sacrificial layer 121 located on the bottom of the plurality of sacrificial layers 120 in the Z-axis direction may further have the insulating layer 141 disposed therebelow and that insulating layer 141 may extend to have a length identical to that of the sacrificial layer 121.

Figure 15B:
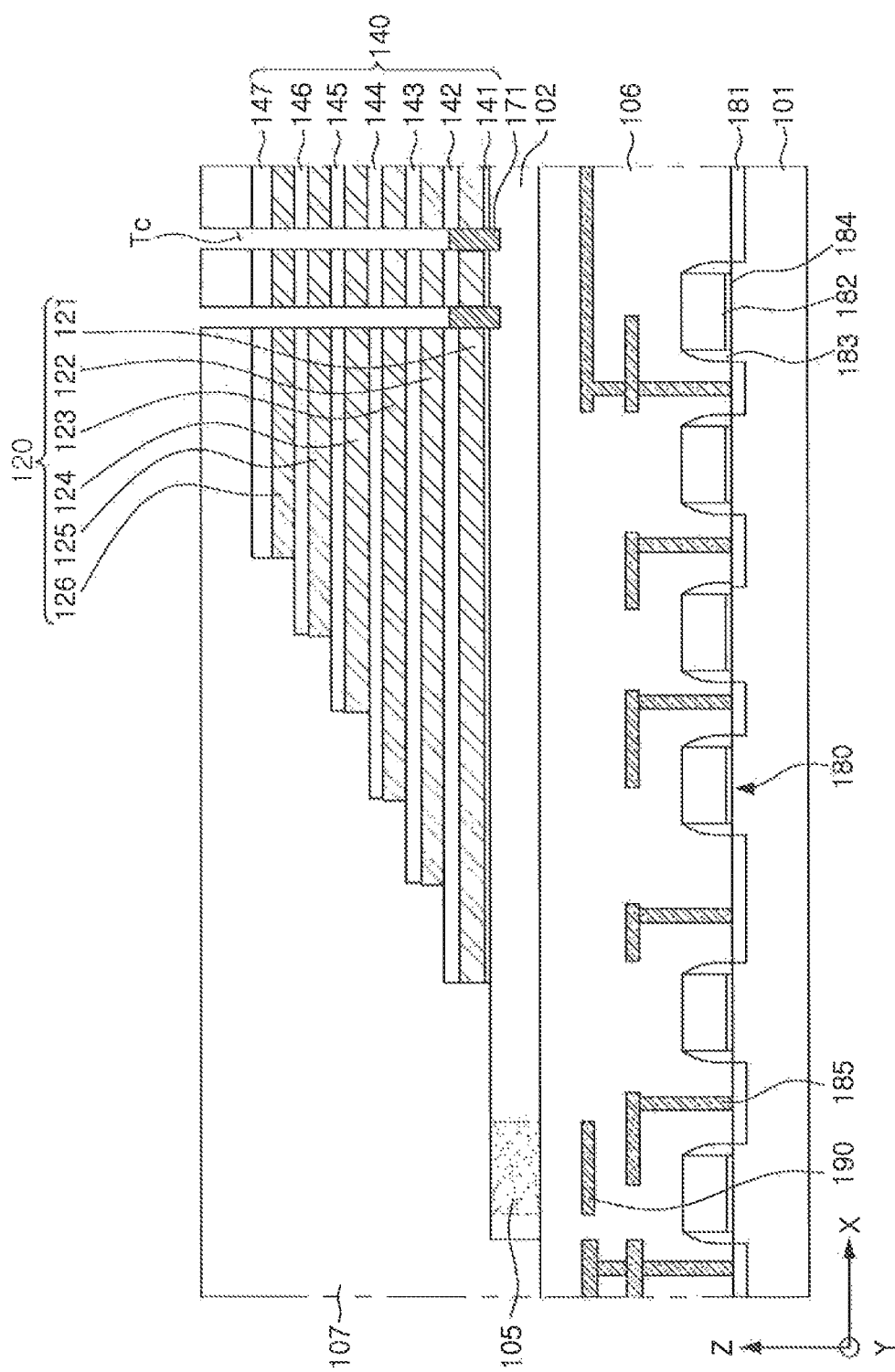

Referring to FIGS. 15A and 15B, a plurality of channel openings Tc for forming the channel regions CH may be formed. The channel openings Tc may have depths at which at least a portion of the second substrate 102 is bored from the upper surface of the second substrate 102. Therefore, the bored portion of the second substrate 102 may be exposed through lower surfaces of the channel openings Tc. Prior to formation of the channel openings Tc, the second insulating layer 107 may be formed on the plurality of sacrificial layers 120 and the plurality of interlayer insulating layers 140. On the X-Y plane on which the second substrate 102 is not formed, the second insulating layer 107 may be connected to the first insulating layer 106.

Figure 16B:
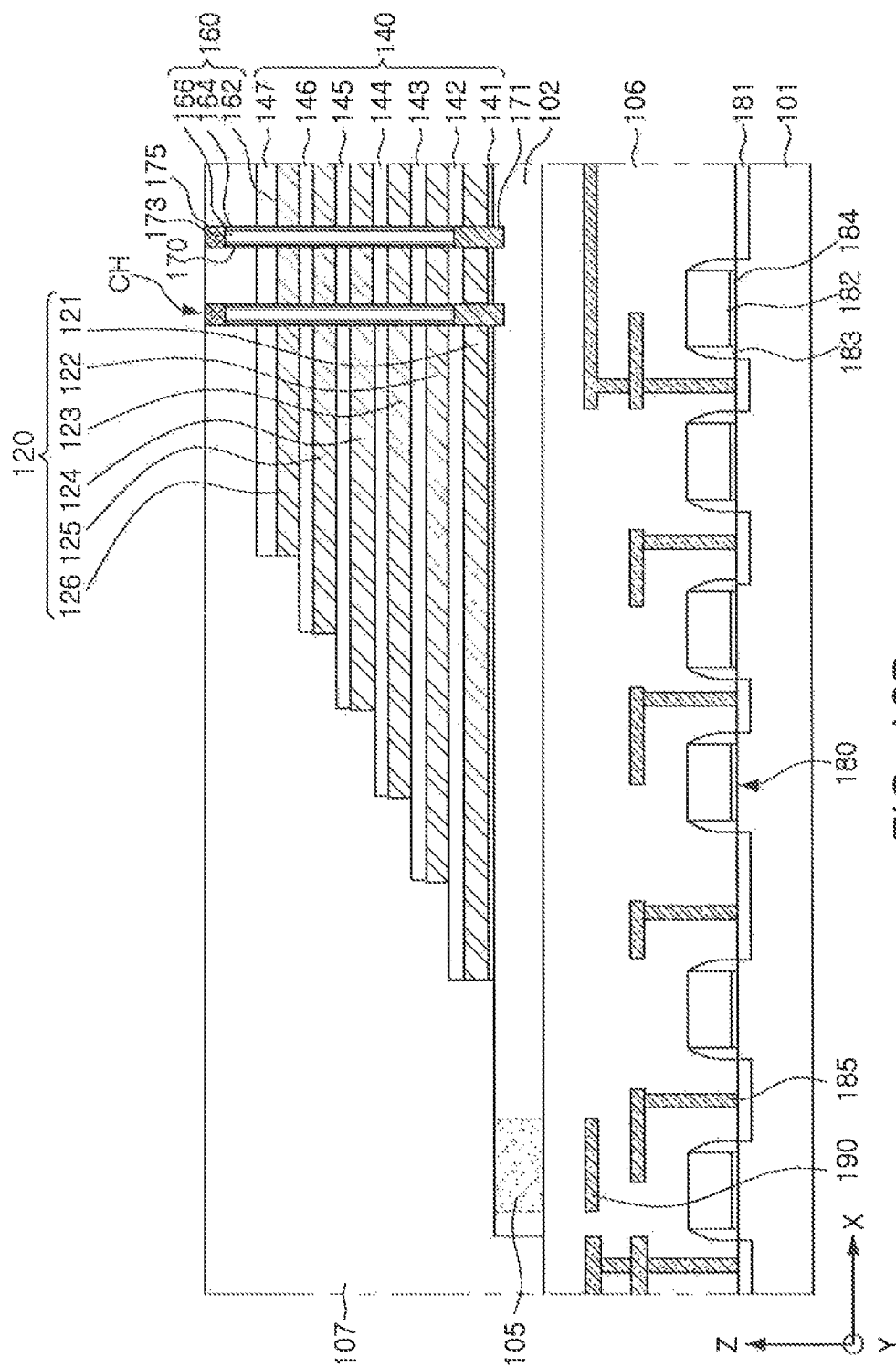

Subsequently, referring to FIGS. 16A and 16B, the channel layers 170, the embedded insulating layers 173, the drain regions 175, and the like may be formed in the channel openings Tc to form the channel regions CH. Prior to formation of the channel layers 170, the embedded insulating layers 173, the drain regions 175, and the like, the SEG process may be performed using regions of the second substrate 102 exposed by the channel openings Tc as seeds. The SEG process may allow the epitaxial layers 171 to be formed on lower portions of the channel regions CH, respectively.

In addition, prior to formation of the channel layers 170, an atomic layer deposition (ALD) process or a chemical vapor deposition (CVD) process may be applied to insides of the channel openings Tc to form the electric charge storage layers 164 and the tunneling layers 166 on inner surfaces and lower surfaces of the plurality of channel openings Tc, respectively. The electric charge storage layers 164 and the tunneling layers 166 may be sequentially stacked on each other from regions in which the electric charge storage layers 164 and the tunneling layers 166 are adjacent to the sacrificial layer 120 and the interlayer insulating layer 140. Further, the channel layers 170 may be formed on insides of the tunneling layers 166, respectively. The channel layers 170 may have a certain thicknesses, for example, thicknesses from about $1/50^{th}$ to about $1/5^{th}$ of widths of the channel openings Tc. The channel layers 170 may be formed using, for example, an ALD or CVD process.

Insides of the channel layers 170 may be filled with the embedded insulating layers 173, respectively. Prior to formation of the embedded insulating layers 173, a hydrogen annealing operation of thermally treating a structure in which the channel layers 170 are formed under a gas atmosphere may be selectively performed. The gas atmosphere may include hydrogen or heavy hydrogen. The hydrogen annealing operation may allow many defective parts of a crystal present in the channel layers 170 to be corrected. Next, the drain regions 175 may be formed on the channel layers 170, respectively, using a conductive material, such as polycrystalline silicon.

Figure 17A:
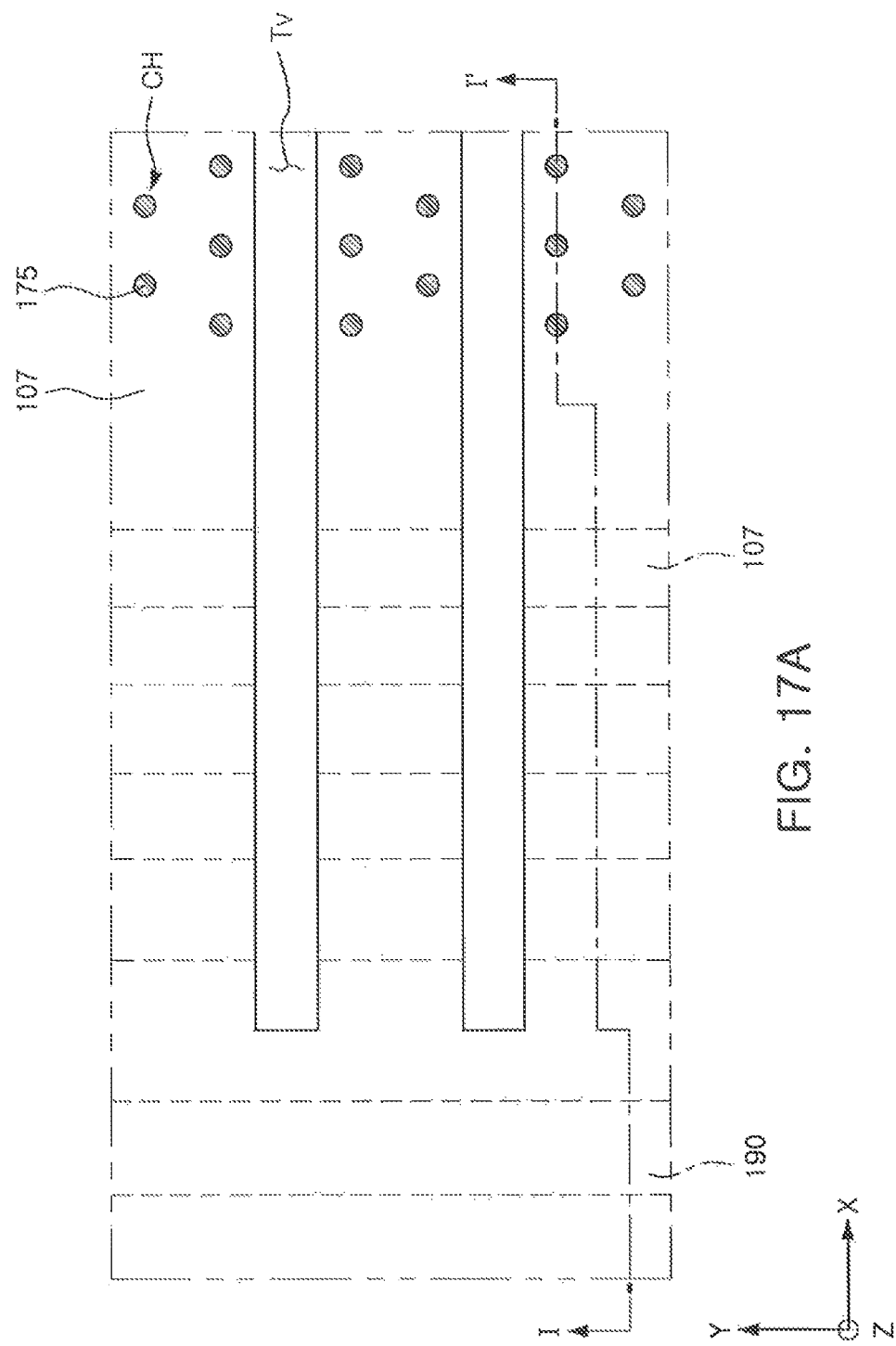
Figure 17B:
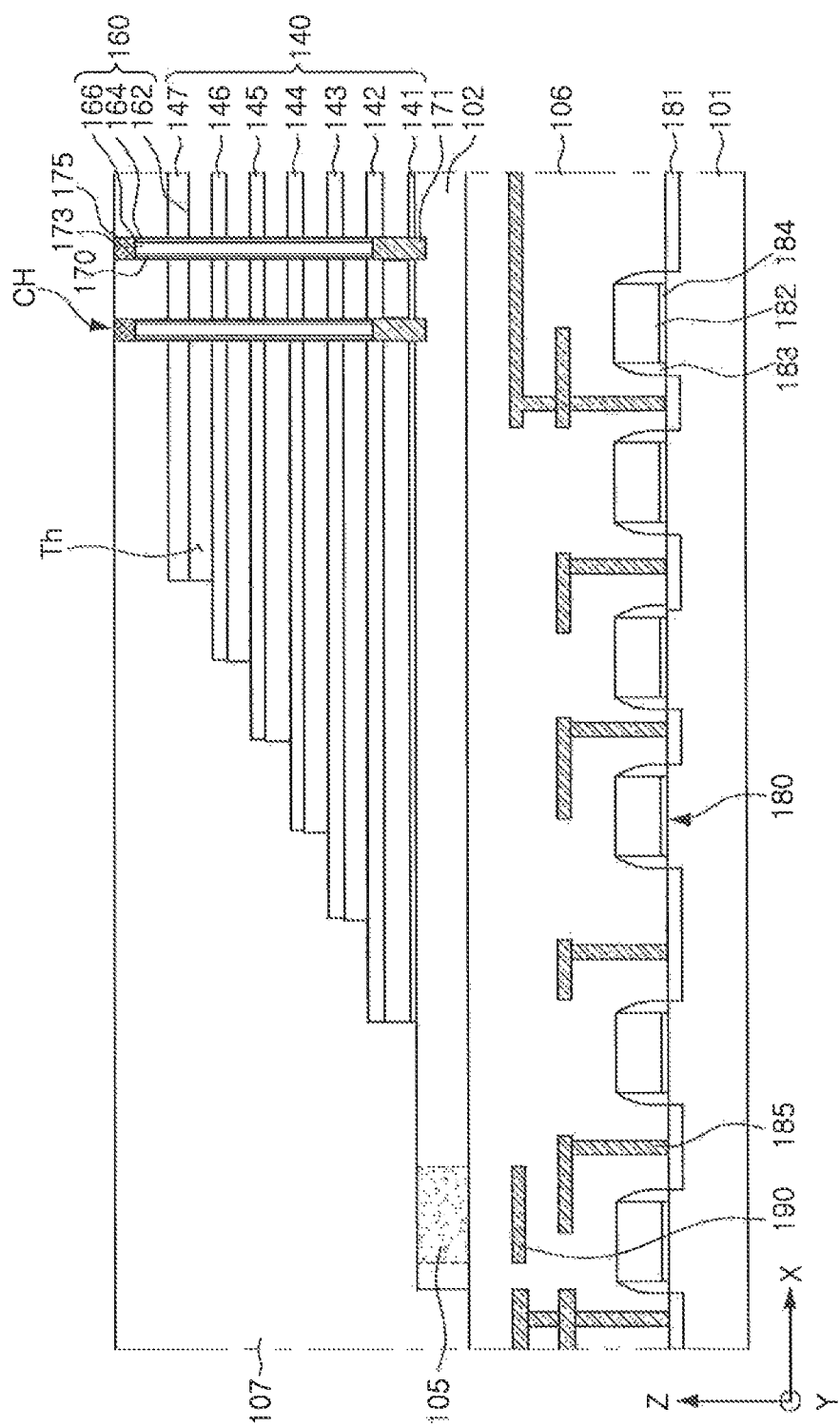

Referring now to FIG. 17A, a plurality of vertical openings Tv may be formed. The plurality of vertical openings Tv may be regions on which the common source lines 103 and the isolation insulating layers 104 will later be formed. Referring to FIG. 17B, an etchant flowing through a plurality of vertical openings Tv may allow the sacrificial layer 120 to be selectively removed except for the interlayer insulating layer 140. By removing the sacrificial layer 120, a plurality of horizontal openings Th may be provided between each of the plurality of interlayer insulating layers 141 to 147, respectively. The lateral portions of the electric charge storage layers 164 may be exposed by the plurality of horizontal openings Th. Further, prior to formation of the plurality of vertical openings Tv, additional insulating layers may be disposed on the drain regions 175 to protect the channel regions CH.

Figure 18A:
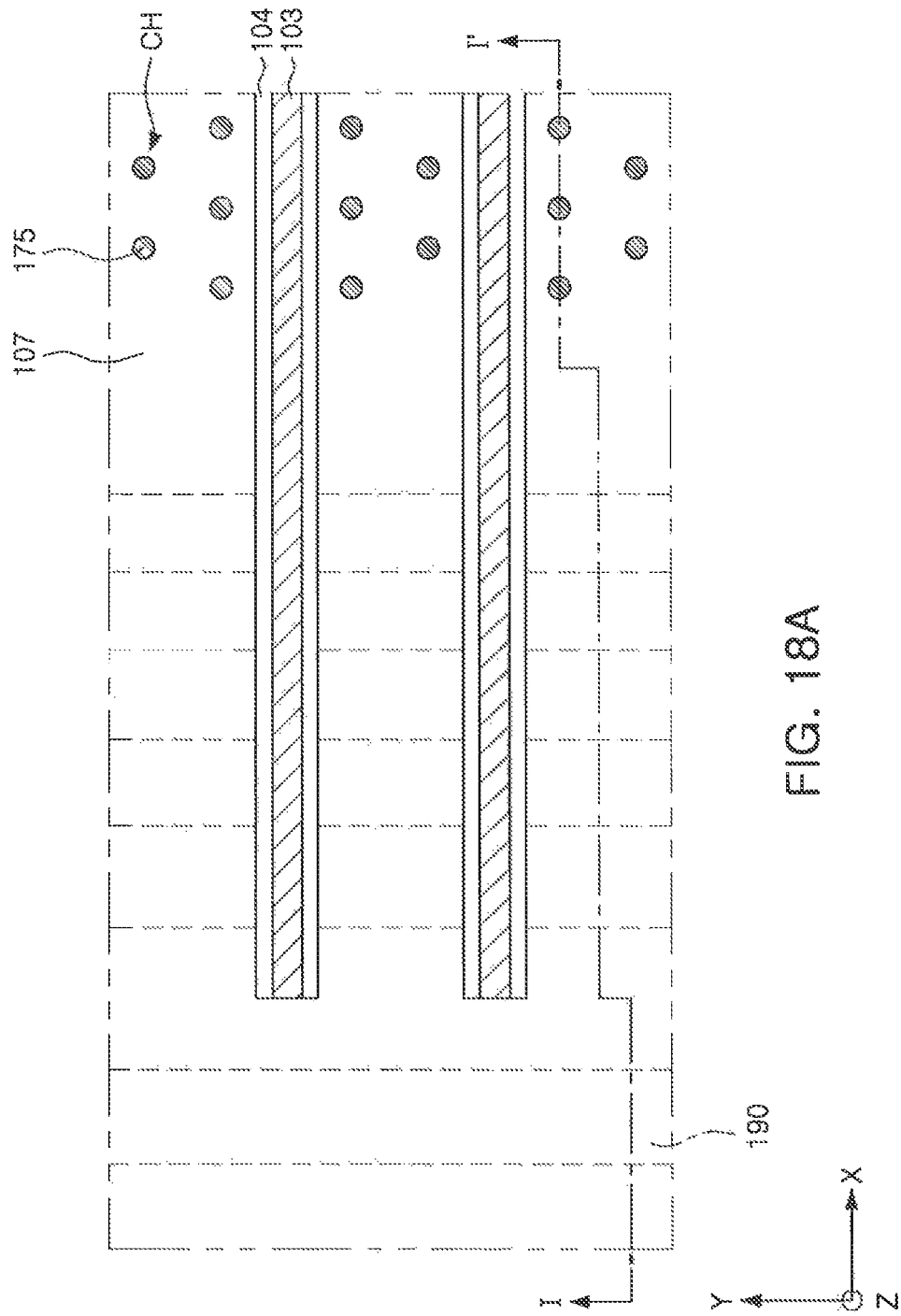
Figure 18B:
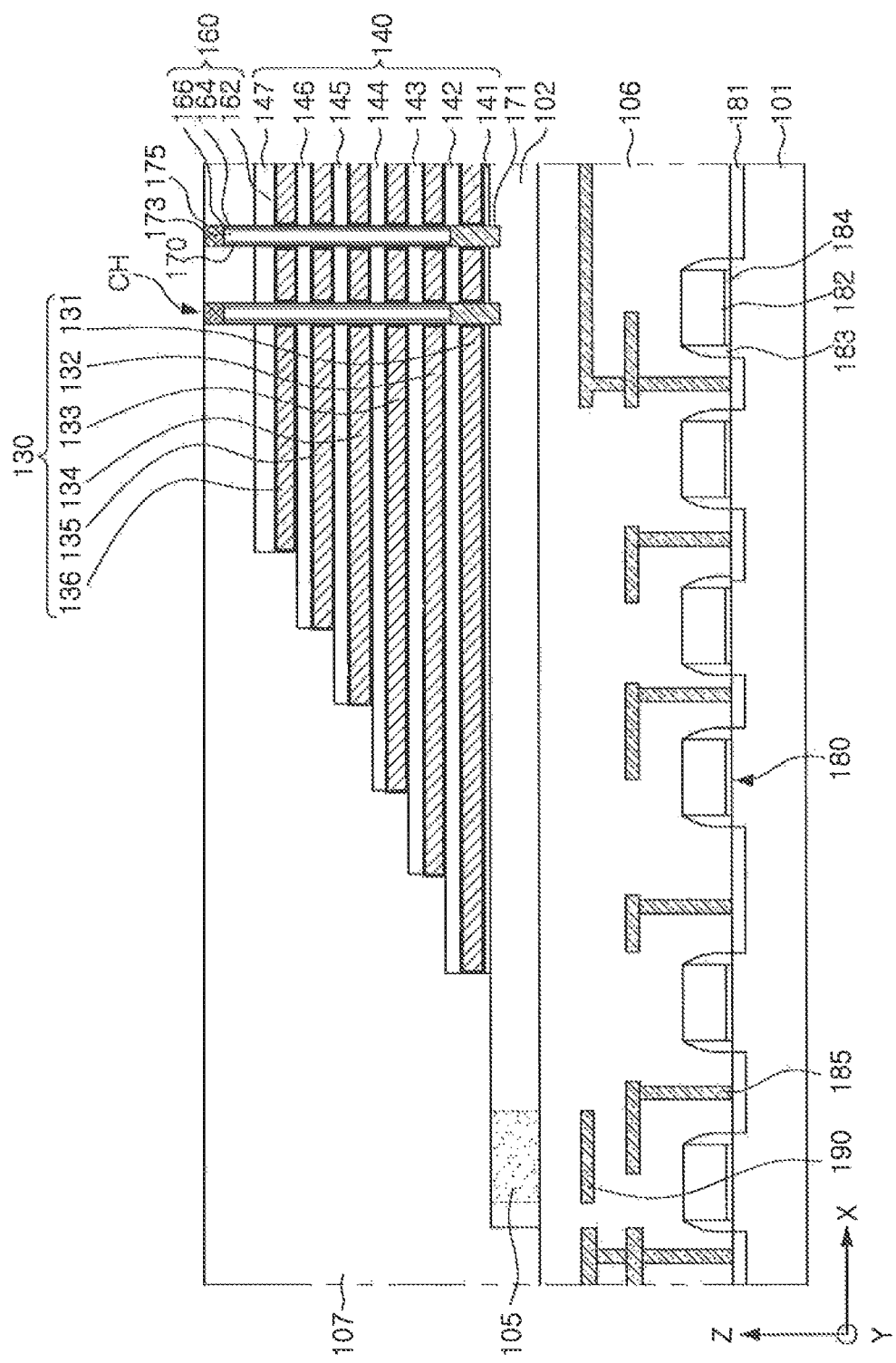

Referring to FIGS. 18A and 18B, the plurality of gate electrode layers 130 may be formed in the plurality of horizontal openings Th provided by removing the sacrificial layer 120. In this case, prior to formation of the plurality of gate electrode layers 130, the blocking layers 162 may be formed on inner walls of the horizontal openings Th, respectively. The plurality of gate electrode layers 130 may include a material, such as a metal, polycrystalline silicon, or a metal silicide. The metal silicide material may be, for example, a silicide material of a metal selected from Co, Ni, Hf, Pt, W and Ti, or combinations thereof. When the plurality of gate electrode layers 130 include the metal silicide material, silicon (Si) and an additional metal layer may be sequentially embedded in the horizontal openings Th, and a siliciding process for the horizontal openings Th may be performed, thereby forming the plurality of gate electrode layers 130.

In addition, the isolation insulating layers 104 and the common source lines 103 may be formed in the vertical openings Tv. Prior to formation of the isolation insulating layers 104 and the common source lines 103, an impurity such as an n-type impurity may be injected onto a region of the second substrate 102 exposed by the vertical openings Tv to provide a second impurity region. The second impurity region may be provided as a source region, and the isolation insulating layers 104 and the common source lines 103 may be sequentially formed later.

Figure 19B:
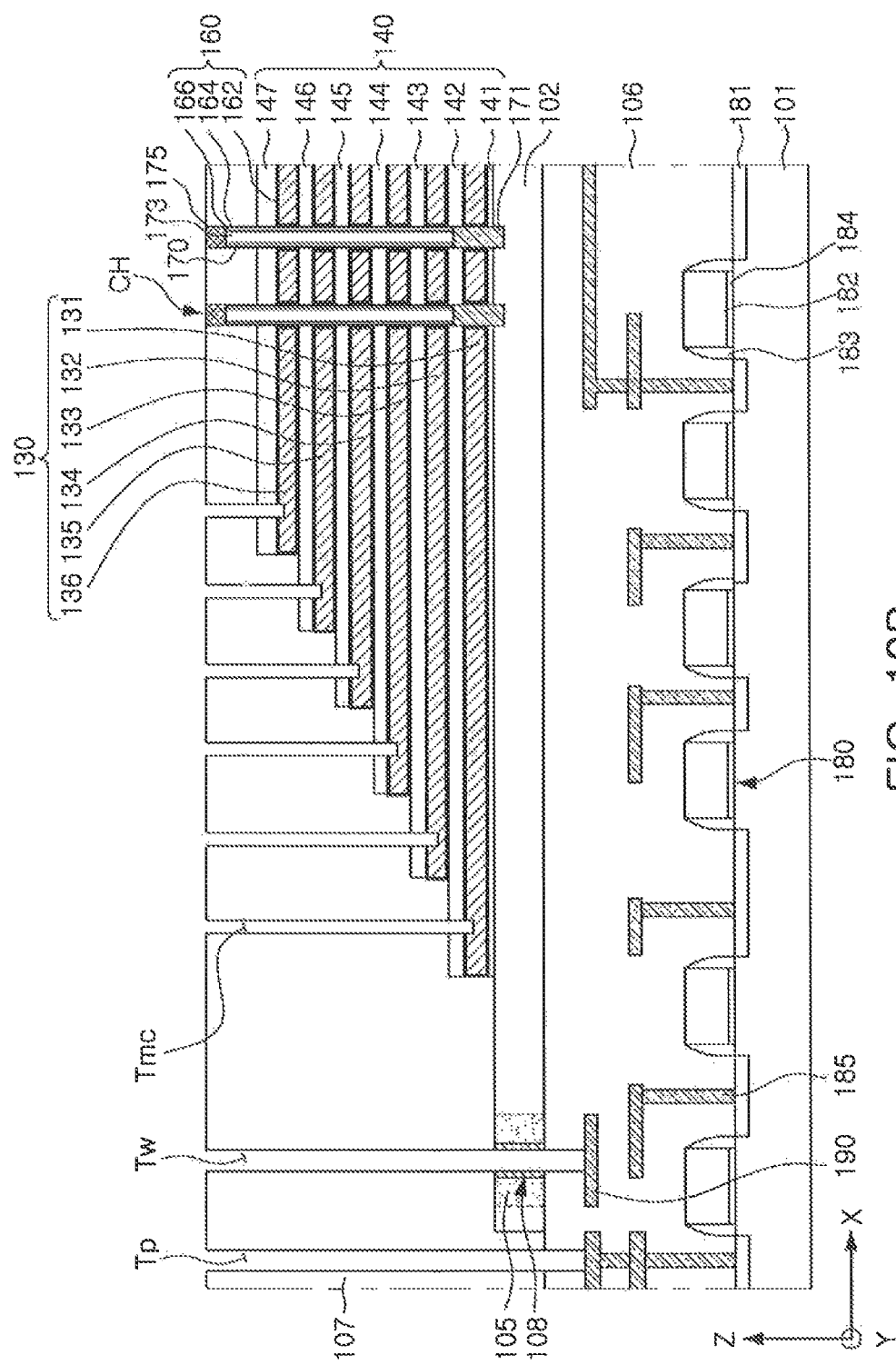

Next, referring to FIGS. 19A and 19B, contact openings Tmc, Tw, and Tp for forming the first to third contacts 111 to 118 (e.g., generally denoted as 110) in the region in which the stepped structure is formed. The contact openings Tmc, Tw, and Tp may include well openings Tw for forming the first contacts 117 connected to the first impurity region 105 of the second substrate 102, memory cell openings Tmc for forming the second contacts 111 to 116 connected to the gate electrode layer 130, peripheral openings Tp for forming the third contacts 118 connected to the plurality of circuit elements 180 disposed on the peripheral region P, and the like.

To form the contact 110, a selective etching process may be performed in the Z-axis direction from the upper surface of the second insulating layer 107 to form the plurality of contact openings Tmc, Tw, and Tp in the Z-axis direction. The plurality of contact openings Tmc, Tw, and Tp may have a tapered structure in which widths of the contact openings Tmc, Tw, and Tp are narrowed toward the second substrate 102. The narrowing of the width may be due to high aspect ratios.

Referring to FIG. 19B, the memory cell openings Tmc and the peripheral openings Tp may include the gate electrode layer 130 and the wiring pattern 185 disposed therebelow and containing a metallic material. Since the first and second insulating layers 106 and 107 may have a high etch selectivity for the plurality of gate electrode layers 130 and the wiring pattern 185, the memory cell openings Tmc and the peripheral openings Tp may have required depths, respectively, without being excessively etched.

In addition, the well openings Tw may have depths at which the first impurity region 105 provided on the second substrate 102 may be exposed. When the well openings Tw are formed along with the memory cell openings Tmc or the peripheral openings Tp, etch selectivity of the first and second insulating layers 106 and 107 for the second substrate 102 is not high. Therefore, the second substrate 102 may be penetrated so that a portion of the wiring pattern 185 or the circuit elements 180 may be exposed by the well openings Tw. In this case, the formed well openings Tw may allow the first impurity region 105 of the second substrate 102 to be unintentionally connected to the wiring pattern 185 or the circuit elements 180, the memory device 100 to not operate properly. To reduce operating errors, the well openings Tw may be formed by using an additional process different from a process of forming the memory cell openings Tmc and the peripheral openings Tp. However, the number of process operations may be increased, and thus the formation of the well openings Tw may thus be costly or time consuming.

In an exemplary embodiment of the present inventive concept, however, the protective layer 190 may be disposed below the first impurity region 105. A material of the protective layer 190 may be selected such that the first and second insulating layers 106 and 107 may have high etch selectivity for the protective layer 190. For example, when the first and second insulating layers 106 and 107 are silicon oxide films, the protective layer 190 may be a silicon nitride film. The protective layer 190 may be formed of a metallic material like that included in the wiring pattern 185 or the gate electrode layer 130. Therefore, when the second substrate 102 is penetrated by the well openings Tw, the protection layer 190 may prevent the well openings Tw from being unintentionally connected to the wiring pattern 185 or the circuit elements 180.

Figure 20A:
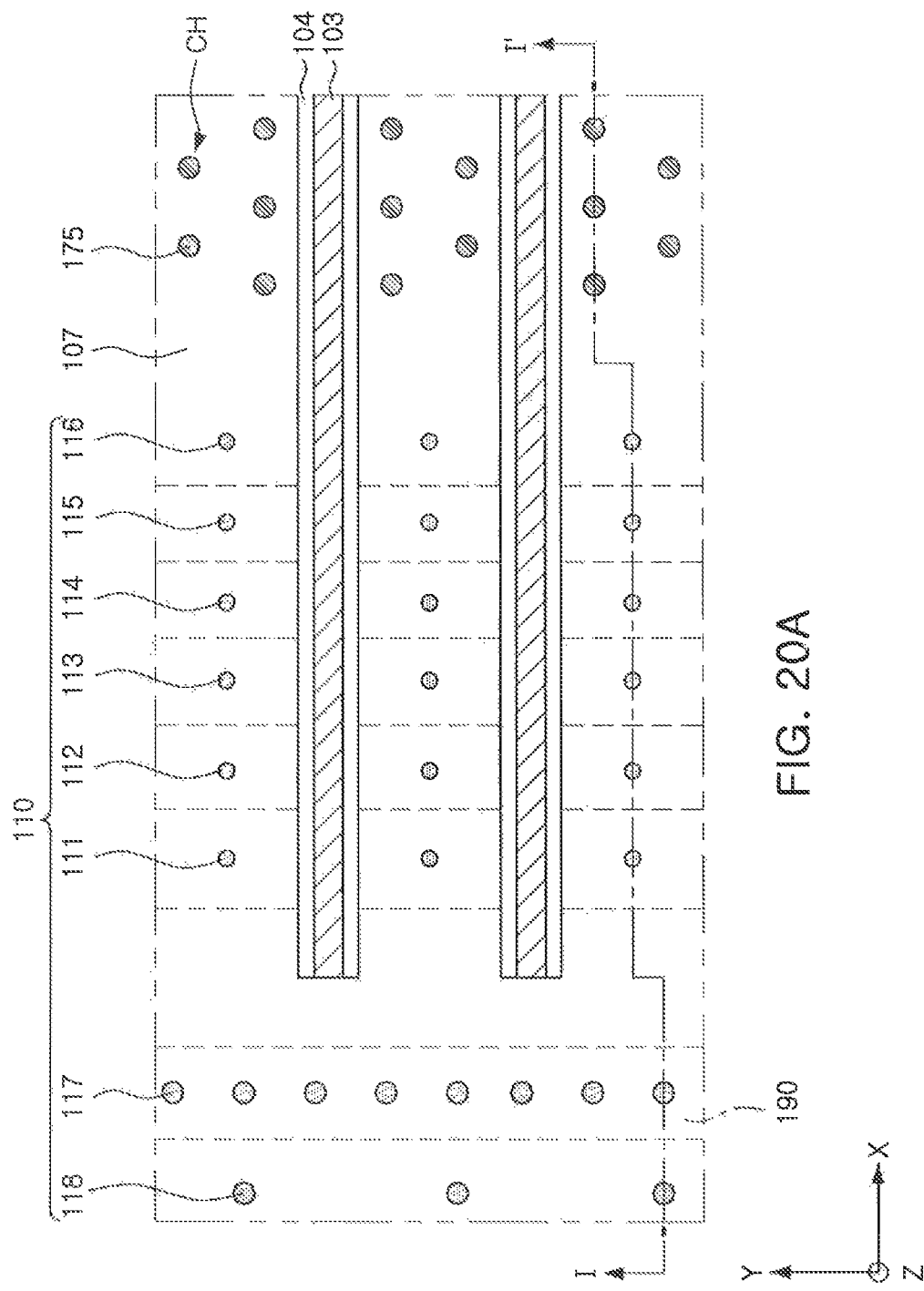
Figure 20B:
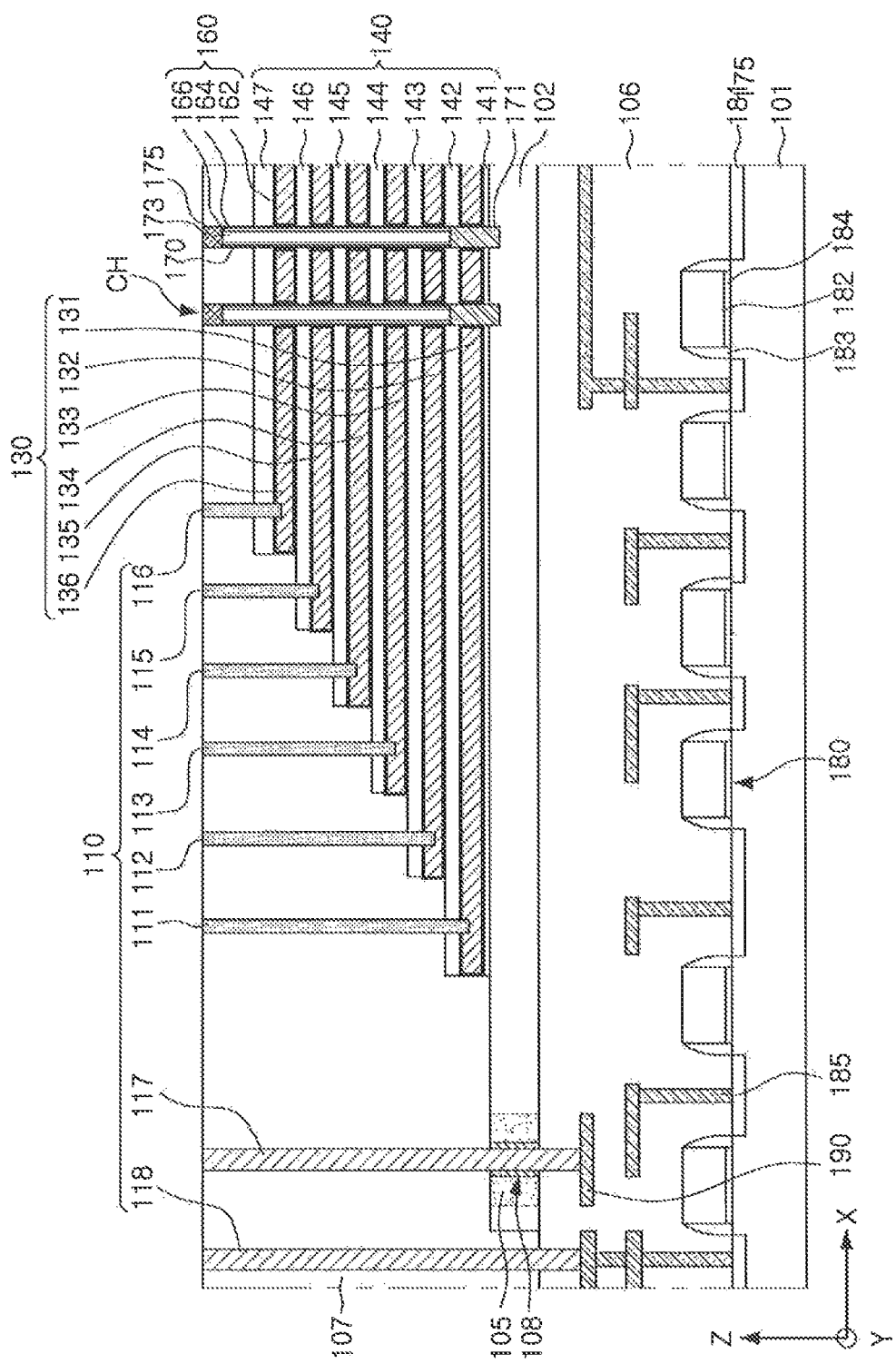

Next, referring to FIGS. 20A and 20B, the plurality of contact openings Tmc, Tw, and Tp may be filled with a conductive material to form the plurality of contacts 111 to 118 (e.g., generally denoted as 110). The plurality of contacts 110 may include the first contacts 117 connected to the first impurity region 105, the second contacts 111 to 116 connected to the gate electrode layer 130, the third contacts 118 connected to the circuit elements 180 of the peripheral region P, and the like. Referring to FIGS. 20A and 20B, the first contacts 117 may be disposed between the second contacts 111 to 116 and the third contacts 118. The second contacts 111 to 116 may be connected to word lines in a subsequent process.

Further, prior to formation of the first contacts 117, the barrier layers 108 may be formed on surfaces of the first impurity region 105 exposed by the well openings Tw, respectively. The barrier layers 108 may contain titanium nitride (TiNx) or tantalum (Ta), and may be formed using an ALD or CVD process. The barrier layers 108 may prevent pollution caused by an impurity material included in the first impurity region 105 when the first contacts 117 are formed.

Figure 21A:
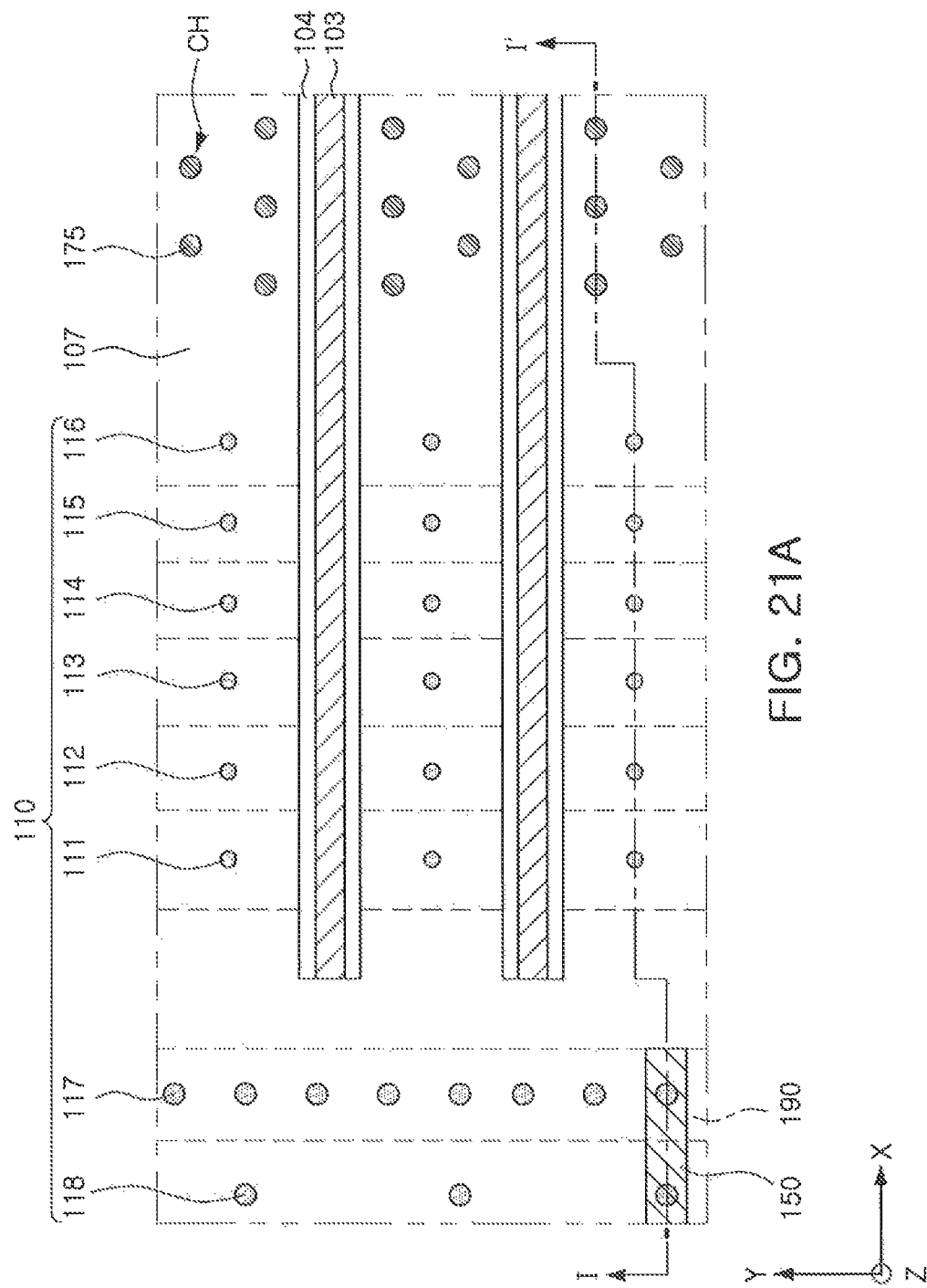
Figure 21B:
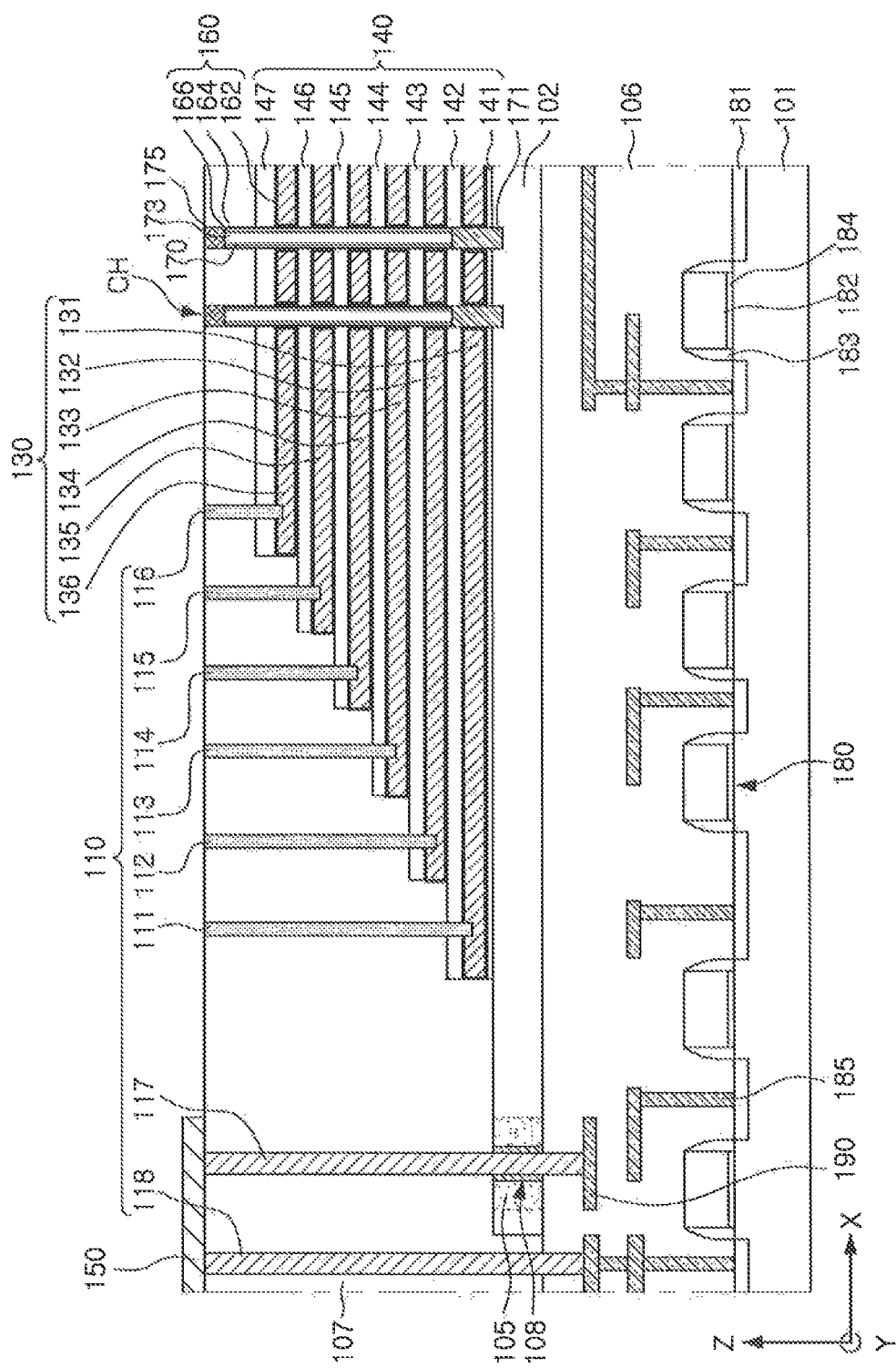

Referring to FIGS. 21A and 21B, the metal layer 150 formed on the upper surface of the second insulating layer 107 may allow the first contacts 117 to be connected to the third contacts 118. By connecting the first contacts 117 to the third contacts 118, the first impurity region 105 may receive a voltage signal from the circuit elements 180. The voltage signal received by the first impurity region 105 may allow an erase operation to be performed. The erase operation includes erasing data stored in the memory cells for the cell region C.

FIGS. 22A through 24B Eire views describing a method of manufacturing the memory device illustrated in FIGS. 6 through 8, respectively, according to an exemplary embodiment of the present inventive concept. FIG. 22B is a cross-sectional view taken along line II-II' of FIG. 22A according to an exemplary embodiment of the present inventive concept.

Figure 22A:
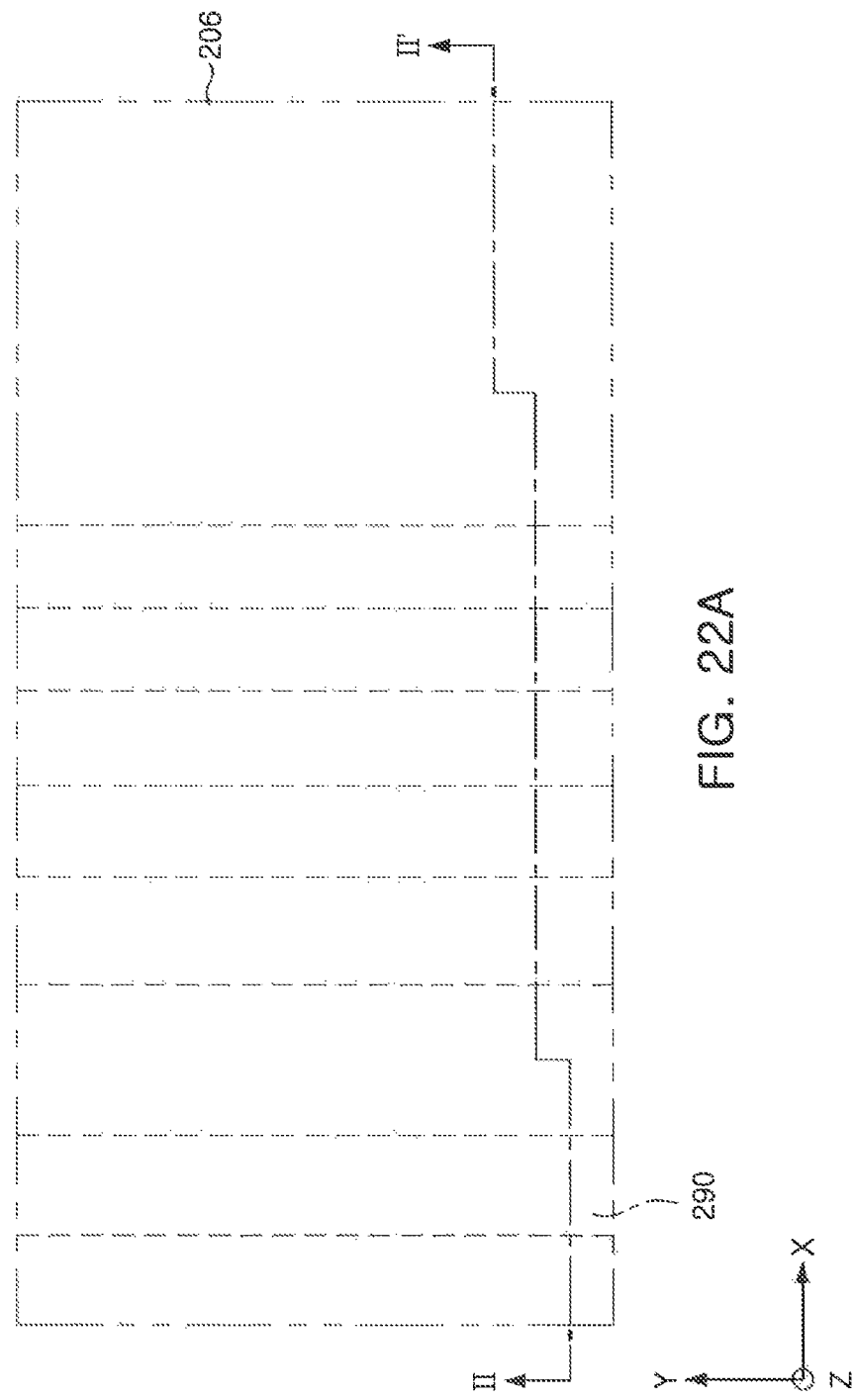
FIGS. 22A through 24B are views of a method of manufacturing the memory device illustrated in FIGS. 6 through 8, respectively.
Figure 22B:
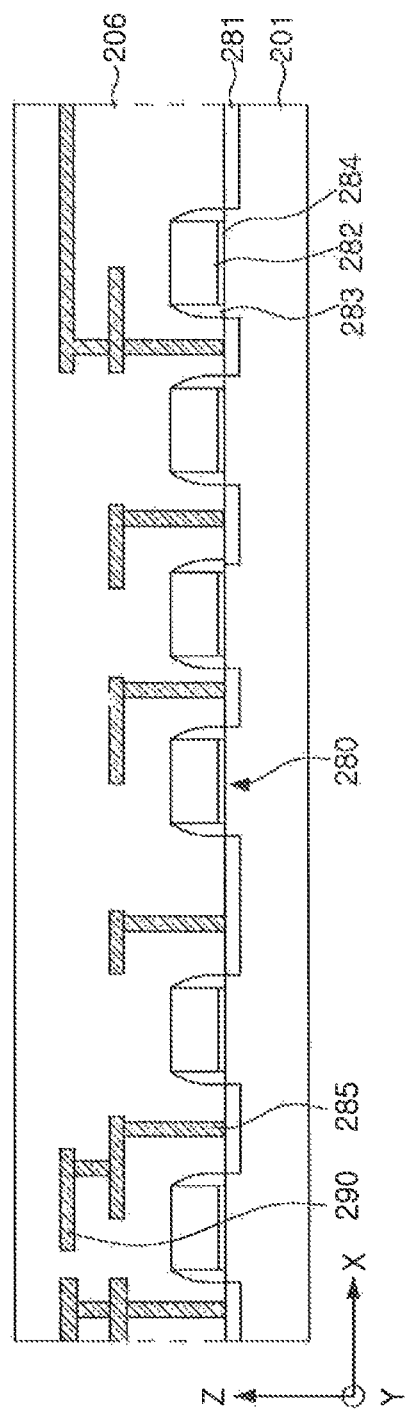

First, referring to FIGS. 22A and 22B, the peripheral region P may be provided. The peripheral region P may include the first substrate 201 containing a semiconductor material, the plurality of circuit elements 280 formed on the first substrate 201, the first insulating layer 206 covering the plurality of circuit elements 280, and the like. Each of the plurality of circuit elements 280 may include the source/drain region 281, the planar gate electrode 282, the planar gate spacer film 283, the planar gate insulating layer 284, and the like. The wiring pattern 285 and the protective layer 290 may be disposed in the first insulating layer 206. The protective layer 290 may be electrically connected to at least a portion of the wiring pattern 285.

Figure 23A:
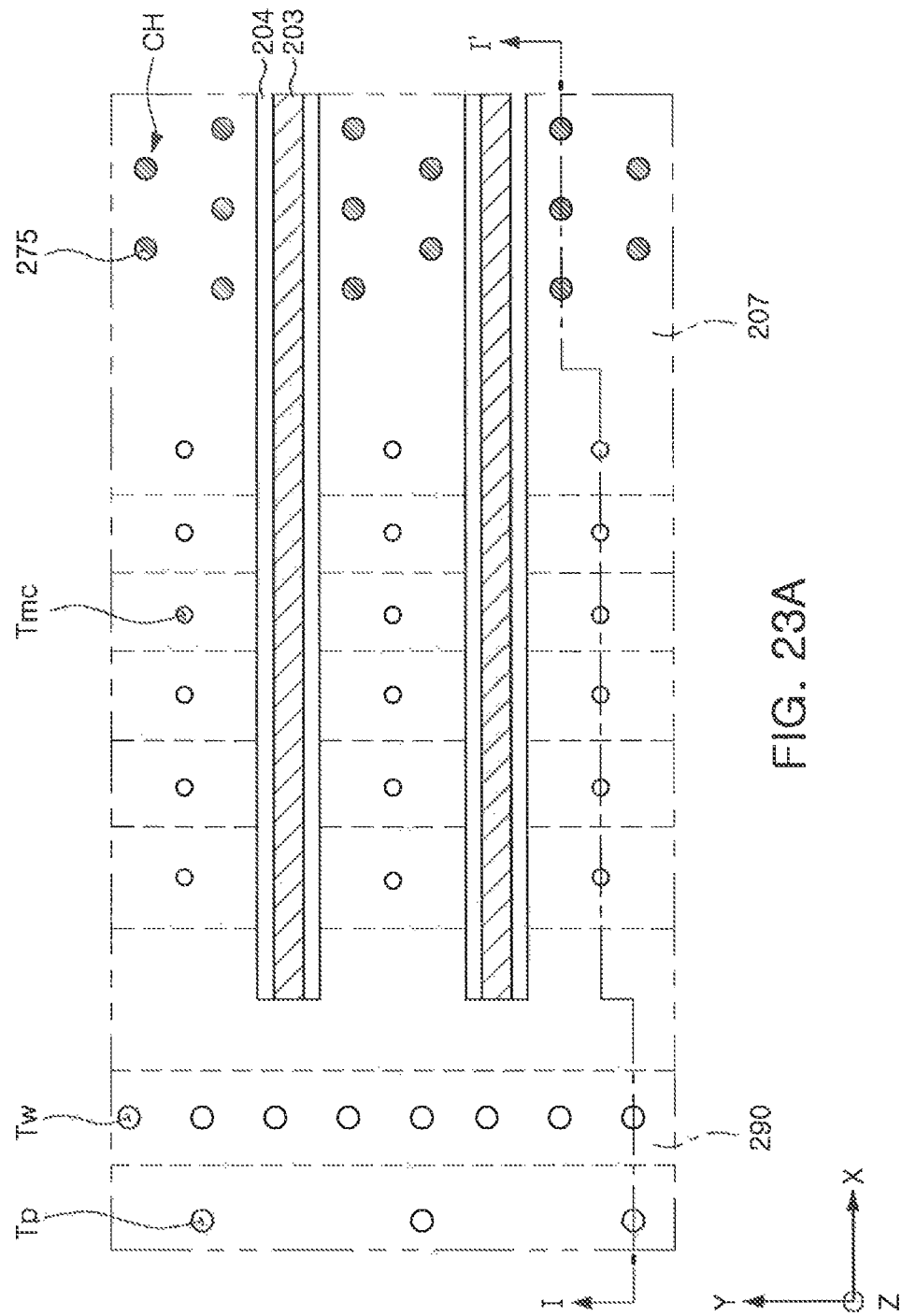
Figure 23B:
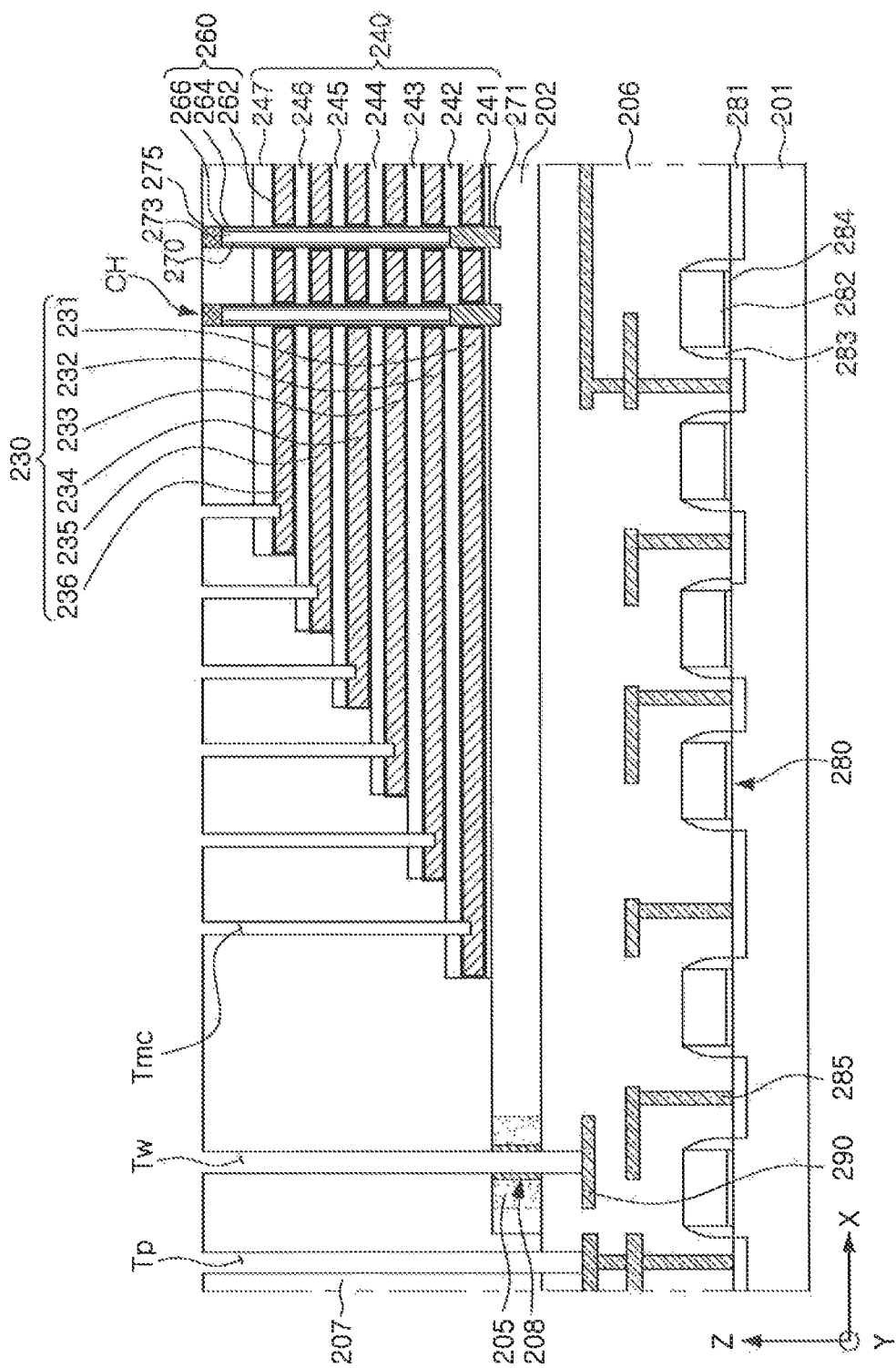

Referring to FIGS. 23A and 23B, the first insulating layer 206 may have the cell region C formed on the upper surface thereof. The cell region C may include the second substrate 202 provided on the upper surface of the first insulating layer 206, the plurality of gate electrode layers 231 to 236 (e.g., generally denoted as 230) and the plurality of interlayer insulating layers 241 to 247 (generally denoted as 240) alternately stacked on each other on the upper surface of the second substrate 202. The cell region C may further include the channel regions CH, the first impurity region 205 surrounding the plurality of gate electrode layers 230, and the like. The plurality of gate electrode layers 230 and the plurality of interlayer insulating layers 240 may extend in a direction (e.g., the X-axis direction) by different lengths, respectively, to form the stepped structure, and the second insulating layer 207 may be provided on the plurality of gate electrode layers 230.

Each of the channel regions CH may include the epitaxial layer 271, the channel layer 270, the embedded insulating layer 273, the drain region 275, and the like. The plurality of gate insulating layers 260 may be disposed between the channel layer 270 and the gate electrode layer 230, and each of the plurality of gate insulating layers 260 may include the blocking layer 262, the electric charge storage layer 264, and the tunneling layer 266 sequentially disposed from the plurality of gate electrode layers 230.

Further, as illustrated in FIGS. 23A and 23B, portions of the first and second insulating layers 206 and 207 may be selectively removed to form the contact openings Tmc, Tw, and Tp for forming the first to third contacts 211 to 218. The contact openings Tmc, Tw, and Tp may include well openings Tw for forming the first contacts 217 connected to the plurality of gate electrode layers 230, memory cell openings Tmc for forming the second contacts 211 to 216 connected to the first impurity region 205, peripheral openings Tp for forming the third contacts 218 connected to the circuit elements 280 of the peripheral region P, and the like.

The portions of the plurality of gate electrode layers 230 may be exposed through the lower portions of the memory cell openings Tmc. In addition, the portions of the wiring pattern 285 of the peripheral region P may be exposed through the lower portions of the peripheral openings Tp. Further, in an exemplary embodiment of the present inventive concept, the portions of the first impurity region 205 may be exposed by the well openings Tw. In the exemplary embodiments illustrated in FIGS. 23A and 23B, the lengths of the well openings Tw may be adjusted so that the protective layer 290 may be exposed through the lower portions of the well openings Tw.

Figure 24A:
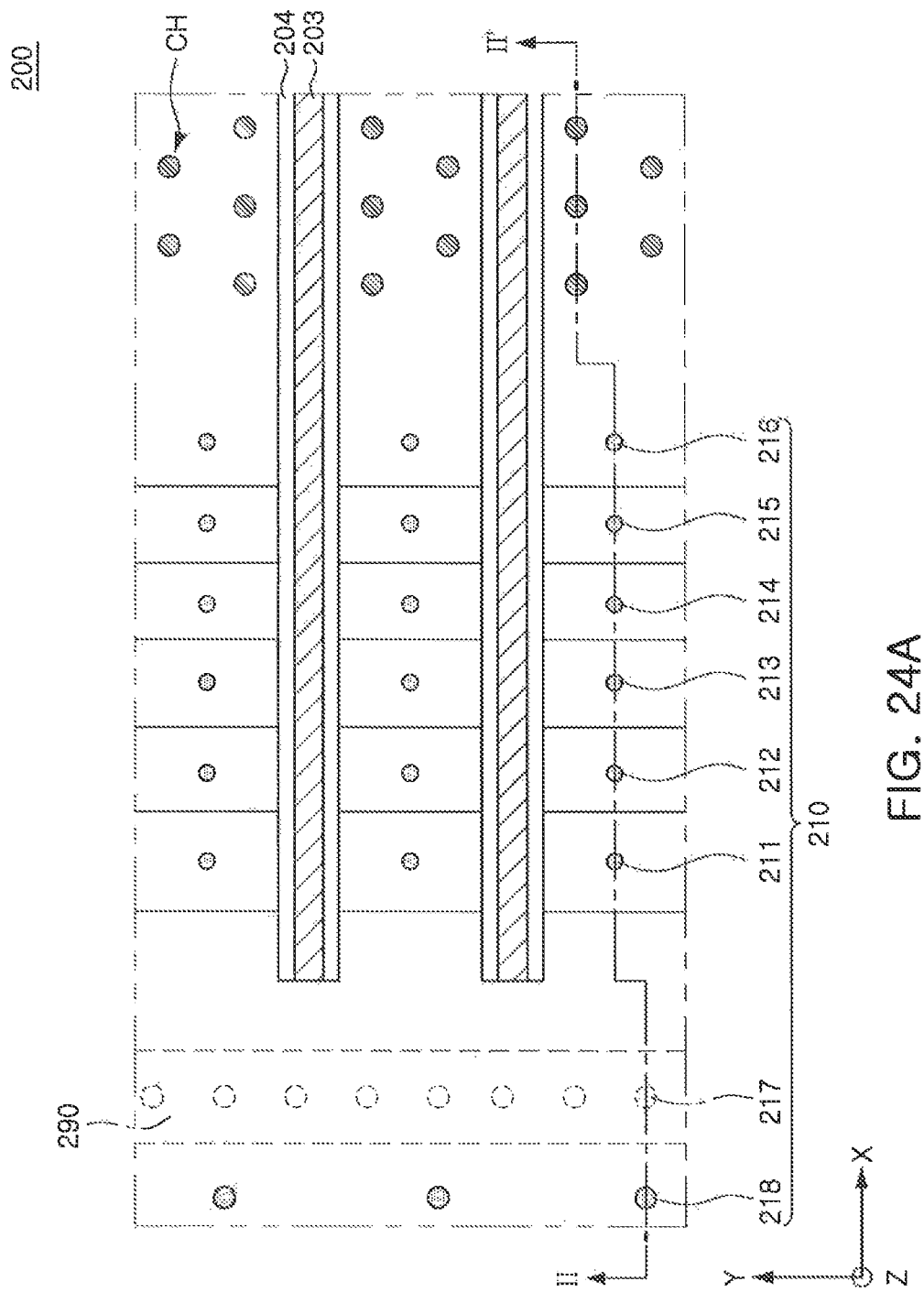

Next, referring to FIGS. 24A and 243, the contact openings Tmc, Tw, and Tp may each be filled with a conductive material to form the first to third contacts 211 to 218 (generally denoted as 210). The plurality of contacts 210 may include the first contacts 217 electrically connected to the first impurity region 205, the second contacts 211 to 216 electrically connected to the plurality of gate electrode layers 231 to 236, and the third contacts 218 electrically connected to the wiring pattern 285 of the peripheral region P.

Figure 24B:
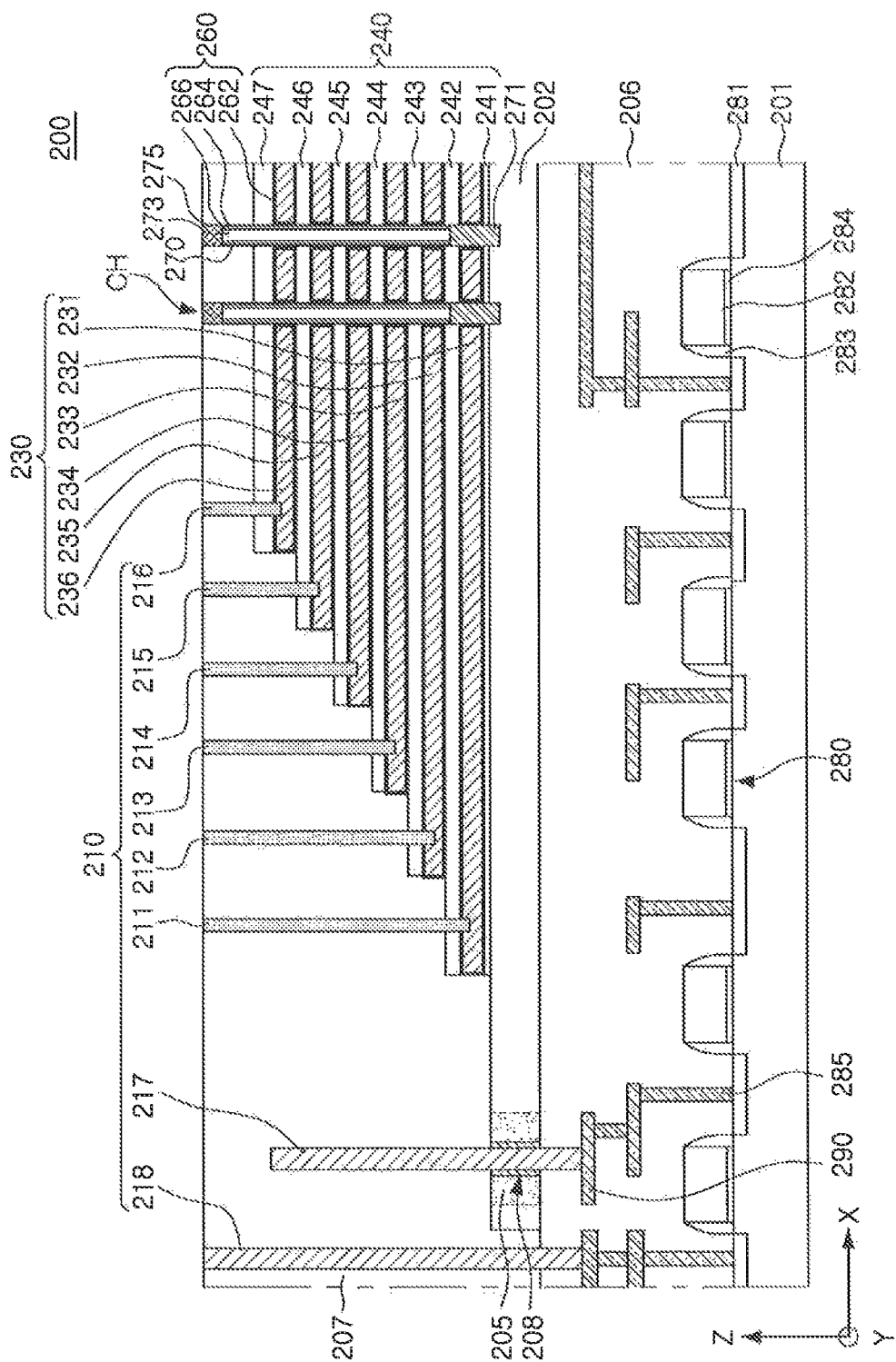

Referring to FIG. 24B, the first contacts 217 may be connected to the protective layer 290 by passing through the first impurity region 205. As described above with reference to FIG. 225, the protective layer 290 may be connected to at least a portion of the circuit elements 280 through the wiring pattern 285 within the first insulating layer 206. For example, the wiring pattern 285 connected to the first contacts 217 within the first insulating layer 206 may allow a certain voltage signal to be selectively applied to the first impurity region 205. The voltage signal may allow an erase operation to be performed. The erase operation might include erasing at least a portion of data stored in the cell region C. The first impurity region 205 and the portion of the circuit elements 280 may be electrically connected to each other through the protective layer 290 within the first insulating layer 206, other than the upper portion of the second insulating layer 207. Therefore, a degree of integration of the memory device 200 may be increased.

Figure 25:
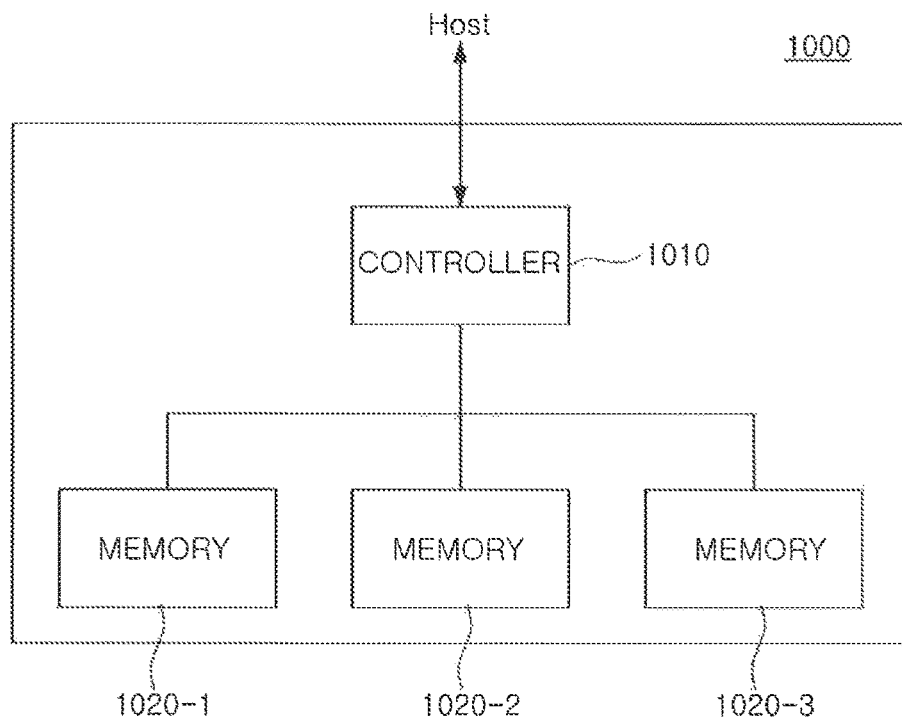
FIGS. 25 and 26 are block diagrams of an electronic device including a memory device according to an exemplary embodiment of the present inventive concept.
Figure 26:
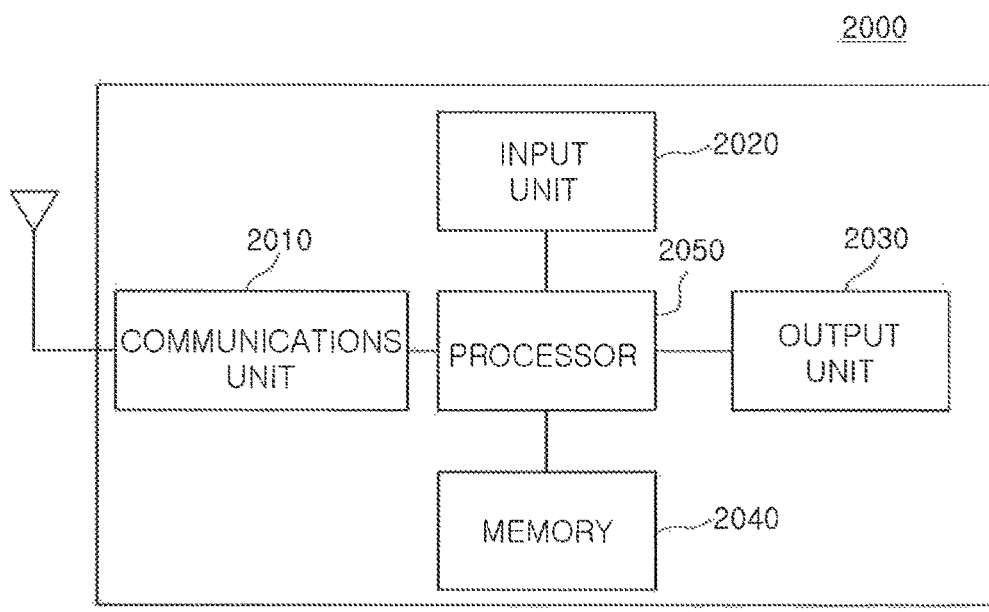

FIGS. 25 and 26 are block diagrams of an electronic device including a memory device according to an exemplary embodiment of the present inventive concept, respectively.

Referring to FIG. 25, a storage device 1000 according to an exemplary embodiment of the present inventive concept may include a controller 1010 communicating with a host and memories 1020-1, 1020-2, and 1020-3 storing data. The respective memories 1020-1, 1020-2, and 1020-3 for may include the memory devices 100, 200, and 300 according to various exemplary embodiments of the present inventive concept described above.

The controller 1010, that receives various requests from the host, may be various electronic devices in which the storage device 1000 is mounted, and may be, for example, a smartphone, a digital camera, a desktop computer, a laptop, a media player, and the like. The controller 1010 may receive a data write or read request transmitted from the host to generate a command (CMD) for storing or retrieving data to/from the memories 1020-1, 1020-2, and 1020-3.

As illustrated in FIG. 25, at least one of the memories 1020-1, 1020-2, and 1020-3 may be connected to the controller 1010 in parallel within the storage device 1000. By connecting the plurality of memories 1020-1, 1020-2, and 1020-3 to the controller 1010 in parallel, the storage device 1000 having a large capacity may be implemented, such as a solid state drive (SSD).

FIG. 26 is a block diagram of an electronic device including a nonvolatile memory device according to an exemplary embodiment of the present inventive concept.

Referring to FIG. 26, an electronic device 2000 according to an exemplary embodiment of the present inventive concept may include a communications unit 2010, an input unit 2020, an output unit 2030, a memory 2040, and a processor 2050.

The communications unit 2010 may include a wired/wireless communications module, such as a wireless Internet module, a short-range communications module, a global positioning system (GPS) module, and a mobile communications module. The wired/wireless communications module included in the communications unit 2010 may be connected to an external communications network based on various communications standards to transmit and receive data.

The input unit 2020, a module for allowing a user to control operations of the electronic device 2000, may include a mechanical switch, a touchscreen, a voice recognition module, and the like. In addition, the input unit 2020 may include a mouse or a finger mouse device operating based on a track ball or a laser pointer, and may further include various sensor modules which enable a user to input data.

The output unit 2030 may output information processed by the electronic device 2000 in an audio or video format. The memory 2040 may store a program for processing data or controlling the processor 2050. The memory 2040 may include at least one of the memory devices 100, 200, and 300 according to various exemplary embodiments of the present inventive concept described above, and the processor 2050 may send a command to the memory 2040 depending on required operations to store or retrieve data to/from the memory 2040.

The memory 2040 may communicate with the processor 2050 through an interface built in the electronic device 2000 or an additional interface. When the memory 2040 communicates with the processor 2050 through the additional interface, the processor 2050 may store or retrieve data to/from the memory 2040 through various interface standards such as secure digital (SD), secure digital high capacity (SDHC), secure digital extended capacity (SDXC), micro SD, universal serial bus (USB), etc.

The processor 2050 may control operations of each component included in the electronic device 2000. The processor 2050 may perform control and processing associated with a voice call, a video call, data communications, and the like, or may conduct control and processing for multimedia reproduction and management. The processor 2050 may also process an input entered by a user through the input unit 2020 and output a result through the output unit 2030. Furthermore, the processor 2050 may store or retrieve data required to control operations of the electronic device 2000 to/from the memory 2040 as described above.

As set forth above, according to exemplary embodiments of the present inventive concept, a memory device may prevent a contact connected to a substrate included in a cell region from passing through the substrate to be connected to a circuit element disposed below the cell region by providing a protective layer within an insulating layer disposed below the cell region. Therefore, reliability of the memory device may be increased, and a degree of integration thereof may be increase.

While exemplary embodiments of the present inventive concept have been shown and described above, it will be apparent to those skilled in the art that modifications and variations could be made without departing from the scope of the present inventive concept as defined by the appended claims.

What is claimed is:

1. A memory device, comprising:
a first region including a first substrate, a plurality of circuit elements disposed on the first substrate, a first insulating layer disposed on the plurality of circuit elements, and a protective layer disposed in the first insulating layer; and
a second region including a second substrate disposed on the first insulating layer, wherein the second substrate includes a first impurity region, a channel region extending in a first direction substantially perpendicular to an upper surface of the second substrate, and a plurality of gate electrode layers stacked on the second substrate and adjacent to the channel region, wherein the protective layer is disposed below the first impurity regions, and includes a plurality of regions separated from each other.

2. The memory device of claim 1, wherein the protective layer has a greater etch selectivity than the second substrate.

3. The memory device of claim 1, wherein the first region includes a wiring pattern connected to the plurality of circuit elements, wherein the wiring pattern and the protective layer extend in a second direction, wherein the first direction is substantially perpendicular to the second direction.

4. The memory device of claim 1, further comprising a plurality of contacts including a plurality of first contacts connected to the first impurity region, a plurality of second contacts respectively connected to the plurality of gate electrode layers, and a plurality of third contacts connected to at least one of the plurality of circuit elements.

5. The memory device of claim 4, wherein the second region includes an upper portion including a first metal layer and a second metal layer, wherein the plurality of first contacts are connected to each by the first metal layer, and at least one of the plurality of circuit elements and the plurality of first contacts are connected to each other by at least one of the plurality of third contacts connected to the second metal layer.

* * * * *